(12) United States Patent
Kubo et al.

(10) Patent No.: US 6,888,725 B2
(45) Date of Patent: May 3, 2005

(54) ELECTRONICS DEVICE UNIT

(75) Inventors: Hideo Kubo, Kawasaki (JP); Masahiro Suzuki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 99 days.

(21) Appl. No.: 10/458,189

(22) Filed: Jun. 11, 2003

(65) Prior Publication Data
US 2003/0218850 A1 Nov. 27, 2003

Related U.S. Application Data

(63) Continuation of application No. PCT/JP00/08744, filed on Dec. 11, 2000.

(51) Int. Cl.$^7$ .......................... H01L 23/367; H05K 7/20
(52) U.S. Cl. ................. 361/719; 361/720; 361/694; 361/695; 454/186; 257/721; 257/722
(58) Field of Search .................. 361/690–695, 361/715–721; 454/184–186; 165/80.3, 80.4, 104.34, 185; 312/223.1–223.3; 257/712–722, 706, 707; 438/123

(56) References Cited

U.S. PATENT DOCUMENTS

| | | | | | |
|---|---|---|---|---|---|
| 4,688,002 | A | * | 8/1987 | Wingate | 330/298 |
| 5,304,846 | A | * | 4/1994 | Azar et al. | 257/722 |
| 5,822,188 | A | * | 10/1998 | Bullington | 361/695 |
| 6,359,779 | B1 | * | 3/2002 | Frank et al. | 361/687 |
| 6,377,459 | B1 | * | 4/2002 | Gonsalves et al. | 361/700 |
| 6,504,718 | B2 | * | 1/2003 | Wu | 361/695 |
| 6,721,180 | B2 | * | 4/2004 | Le et al. | 361/695 |
| 2002/0159237 | A1 | * | 10/2002 | Patel et al. | 361/719 |
| 2003/0169567 | A1 | * | 9/2003 | Tantoush et al. | 361/695 |
| 2004/0100773 | A1 | * | 5/2004 | Hoffman et al. | 361/719 |

FOREIGN PATENT DOCUMENTS

| | | | | |
|---|---|---|---|---|
| EP | 0 099 092 | | 1/1984 | |
| GB | 2062971 A | * | 5/1981 | ............ H05K/7/20 |
| GB | 2164499 A | * | 3/1986 | ............ H05K/7/20 |
| JP | 61-129349 | | 8/1986 | |
| JP | 63-221699 | | 9/1988 | |
| JP | 2-130894 | | 5/1990 | |
| JP | 2-118995 | | 9/1990 | |
| JP | 6-120386 | | 4/1994 | |
| JP | 7-111392 | | 4/1995 | |
| JP | 8-250880 | | 9/1996 | |
| JP | 9-8484 | | 1/1997 | |
| JP | 2720072 | | 11/1997 | |
| JP | 10-98139 | | 4/1998 | |
| JP | 11-68362 | | 3/1999 | |
| JP | 2000-91776 | | 3/2000 | |

OTHER PUBLICATIONS

Patent Abstract of Japan of 02168697 A dated Jun. 28, 1990.

* cited by examiner

*Primary Examiner*—Anatoly Vortman
(74) *Attorney, Agent, or Firm*—Staas & Halsey LLP

(57) ABSTRACT

Plural CPUs 20-1 through 20-6 are mounted on a circuit board 11, and heat sinks 30-1 through 30-6 are mounted on these CPUS, respectively. The CPUs 20-1 through 20-6 are cooled by an air flow generated by motor fan units 14-1, 14-2, 15-1, and 15-2. The CPUs 20-1 through 20-6 are arranged such that a ratio of a sectional clearance area at the downstream side of the air flow to a sectional area of a tunnel 12 is lower than a corresponding ratio at the upstream side of the air flow. This clearance is formed between a cover member 13 and the heat sinks 30-1 through 30-6. Air flow passages 85 and 86 are formed at both sides at the upstream side. By the air flow passages 85 and 86, the amount of fresh air that is sent to the heat sinks 30-5 and 30-6 at the downstream side is increased. Accordingly, the cooling of the CPUs 20-5 and 20-6 at the downstream side is promoted compared to the conventional case.

15 Claims, 21 Drawing Sheets

$$U1 = \frac{S70}{S12}$$

$$S70 = S12 - (S30\text{-}1 + S30\text{-}2)$$

$$U2 = \frac{S71}{S12}$$

$$S71 = S12 - (S30\text{-}5 + S30\text{-}6 + S32\text{-}1 + S32\text{-}2)$$

$$\frac{U1}{U2} \geq 1.2$$

ELECTRONICS DEVICE UNIT

This application is a continuing application, filed under 35 U.S.C. §111(a), of International Application PCT/JP00/08744, filed Dec. 11, 2000.

TECHNICAL FIELD

The present invention relates to an electronics device unit, and particularly to an electronics device unit that has a structure in which plural CPUs mounted on a circuit board are cooled by forced draft air provided from a motor fan unit.

A server that constitutes a communication system has a structure in which a plurality of electronics device units are mounted. In each of these electronics device units, a plurality of CPUs are mounted on a circuit board together with heat sinks. The air flow generated by a motor fan unit transfers heat from the heat sinks to provide forced draft cooling to the CPUs.

Recently, a demand for improving server performance has become great. In order to improve the server performance, it is necessary to improve CPU performance. When the CPU performance is improved, an amount of heat generated by the CPU is increased. Accordingly, it becomes necessary to more efficiently perform the forced draft cooling of the CPU.

BACKGROUND ART

FIGS. 1, 2A, 2B, and 2C show a conventional electronics device unit 1. The electronics device unit 1 includes a rectangular circuit board 2 having an upper surface on which CPUs and the like are mounted. The electronics device unit 1 further includes a cover member 13. The cover member 13 includes a ceiling plate part 13a, and side plate parts 13b and 13c at both sides of the cover member 13 to form a tunnel 12. The electronics device unit 1 further includes motor fan units 14-1 and 14-2 that send air into the tunnel 12, and motor fan units 15-1 and 15-2 that discharge the air existing in the tunnel 12. The air flows in the tunnel 12 that is an air flow passage in the direction indicated by the arrows 16 to provide forced draft cooling to the CPUs and the like. As for the air flow, the Y2 direction indicates an upstream side, and the Y1 direction indicates a downstream side. The Y2-Y1 directions are longitudinal directions of the circuit board 2 and the electronics device unit 1, and the X1-X2 directions are width directions of the circuit board 2 and the electronics device unit 1. Six CPUs 20-1 through 20-6, one system control element 21, two memory control elements 22-1 and 22-2, one clock control element 23, a plurality of memory cards 24, and the like are mounted on the upper surface of the circuit board 2. The memory cards 24 are arranged with the memory cards 24 standing, and constitute two memory card groups 25-1 and 25-2. A plurality of connectors 26 are arranged along one side of the circuit board 2. Heat sinks 30-1 through 30-6 are installed on upper surfaces of the CPUs 20-1 through 20-6, respectively. Similarly, a heat sink 31 is installed on an upper surface of the system control element 21, heat sinks 32-1 and 32-2 are installed on upper surfaces of the memory control elements 22-1 and 22-2, respectively, and a heat sink 33 is installed on an upper surface of the clock control element 23.

The electronics device unit 1 is electrically connected to other electronics device units via a back panel board or the like (not shown in the drawings) by the connectors 26 so as to configure a computer main body.

Out of the elements mounted on the circuit board 2, the CPUs 20-1 through 20-6 generate a large amount of heat at the time of the operation, so that targets for forced draft cooling are the CPUs 20-1 through 20-6.

The CPUs 20-1 through 20-6, the system control element 21, the memory control elements 22-1 and 22-2, the clock control element 23, and the memory card groups 25-1 and 25-2 are uniformly dispersed on the circuit board 2. The Y1-Y2 directions correspond to a row, and the X1-X2 directions correspond to a column. That is, the CPUs 20-1 through 20-6 are arranged in two rows and three columns.

FIG. 3A is a cross-sectional view taken along the line IIIA—IIIA of FIG. 2A, i.e., a section orthogonal to the air flow at the positions of the CPUs 20-1 and 20-2 that are located at the upstream side. FIG. 3B is a cross-sectional view taken along the line IIIB—IIIB of FIG. 2A, i.e., a section orthogonal to the air flow at the positions of the CPUs 20-5 and 20-6 that are located at the downstream side. In FIGS. 3A and 3B, the hatched parts indicate the heat sinks 30-1, 30-2, 30-5, and 30-6 that occupy a certain part of the tunnel 12 and that have sectional areas S30-1, S30-2, S30-5, and S30-6, respectively. The areas S30-1, S30-2, S30-5, and S30-6 have the same size of the area. S12 indicates the sectional area of the tunnel 12. S40 indicates the sectional area of a clearance 40 between the cover member 13 and the heat sinks 30-1 and 30-2. That is, S40=S12−(S30-1+S30-2). S41 indicates the sectional area of a clearance 40 between the cover member 13 and the heat sinks 30-5 and 30-6. That is, S41=S12−(S30-5+S30-6).

A ratio S40/S12 (S41/S12) of the clearance area 40 (the clearance area 41) to the sectional area S12 of the tunnel 12 is defined as a clearance ratio U.

As understood from FIGS. 3A and 3B, an air flow passable sectional clearance ratio U2 (S41/S12) at the downstream side is the same as an air flow passable sectional clearance ratio U1 (S40/S12) at the upstream side. That is, U1/U2=1. In addition, an air flow passable sectional clearance ratio at the midstream is also the same as the air flow passable sectional clearance ratio at the upstream side.

As shown in FIG. 2B, a distance in the air flow direction between the CPUs 20-1 and 20-2 at the upstream part and the CPUs 20-3 and 20-4 at the midstream part is equal to a distance in the air flow direction between the CPUs 20-3 and 20-4 at the midstream part and the CPUs 20-5 and 20-6 at the downstream part, and is "a". This distance "a" is about 15 mm.

Next, forced draft cooling of the CPUs 20-1 through 20-6 will be described.

The air flow passable sectional clearance ratios take the same value at all of the upstream part, the midstream part, and the downstream part of the air flow, so that the air flow in the tunnel 12 is uniform.

FIG. 4 shows a result of testing. The test was performed under the condition in which a calorific value (heat release value) of each CPU 20-1 through 20-6 was 100W, a temperature of intake air was 25° C., and a wind speed of the air flowing into the tunnel 12 was 2 m/s. In FIG. 4, the vertical axis indicates the distance in the Y1 direction from the motor fan units 14-1 and 14-2, and the horizontal axis indicates the temperature. While the air flows, the air transfers heat from the heat sink 30-1 and so forth. In other words, while the air flows, the air is heated by the heat sink 30-1 and so forth, and the temperature of the air is raised. The cooling ability of the air (rate of heat transfer) is gradually lowered as the air advances to the downstream side.

As shown by the (curved) line of FIG. 4 and in FIG. 2B, when the air passes through the heat sinks 30-1 and 30-2 at the upstream part, the temperature of the air is raised to 40° C., and the air passes through the heat sinks 30-3 and 30-4 at the midstream part, and flows into the heat sinks 30-5 and 30-6 at the downstream part. At this time the air flows into the heat sinks 30-5 and 30-6, the temperature of the air already reaches 55° C. After the air passes through the heat sinks 30-5 and 30-6 at the downstream part, the temperature of the air is raised to 70° C.

Accordingly, as indicated by the points O1, O2, and O3 of FIG. 4, the temperature of the CPUs 20-1 and 20-2 at the upstream part does not exceed 50° C., the temperature of the CPUs 20-3 and 20-4 at the midstream part does not exceed 70° C., but the temperature of the CPUs 20-5 and 20-6 at the downstream part reaches 90° C. Therefore, there is a possibility that the cooling of the CPUs 20-5 and 20-6 at the downstream part is not sufficient.

In the future, accompanying the improvement of the server, it is expected that the amount of heat generated by each of the CPUs 20-1 through 20-6 will be further increased. In this case, a rate of the temperature rise of the CPUs 20-5 and 20-6 at the downstream part will be greater than a rate of the temperature rise of the CPUs 20-1 and 20-2 at the upstream part and the CPUs 20-3 and 20-4 at the midstream part. The cooling of the CPUs 20-5 and 20-6 at the downstream part will become a serious problem. A size of a space part 50 located directly upstream of the heat sinks 30-5 and 30-6 at the downstream part is the same as a size of a space part 51 located directly upstream of the heat sinks 30-3 and 30-4 at the midstream part. The distances "a" of the space parts 50 and 51 are about narrow 15 mm. Therefore, an amount of the air that flows into the space part 50 from the Y1 direction side and the Y2 direction side is not large. This also contributes to a difficulty in efficiently cooling the CPUs 20-5 and 20-6 at the downstream part.

DISCLOSURE OF THE INVENTION

With the view of the foregoing problems, it is an object of the present invention to provide an electronics device unit that promotes cooling of CPUs at the downstream side.

In order to achieve the above object, according to one aspect of the present invention, an electronics device unit may comprises a circuit board, and a plurality of semiconductor components that are dispersedly mounted on the circuit board, the plurality of semiconductor components generating heat, heat sinks being mounted on the plurality of semiconductor components, respectively. The electronics device unit may further comprise a cover member that is provided for covering the heat sinks and forms a tunnel on the circuit board, a cooling medium flowing in the tunnel. In the electronics device unit, the plurality of semiconductor components may be cooled via the heat sinks by forcing the cooling medium to flow so as to pass through the tunnel. Further, by the arrangement of the plurality of semiconductor components, in a section of the tunnel orthogonal to a flow of the cooling medium in the electronics device unit, a ratio of a sectional area of a clearance at a downstream part of the flow of the cooling medium to a sectional area of the tunnel is smaller than a ratio of a sectional area of a clearance at an upstream part of the flow of the cooling medium to the sectional area of the tunnel, the sectional area of the clearance at the upstream part being obtained by subtracting from the sectional area of the tunnel a sectional area at the upstream part occupied by members that block the flow of the cooling medium, the sectional area of the clearance at the downstream part being obtained by subtracting from the sectional area of the tunnel a sectional area at the downstream part occupied by members that block the flow of the cooling medium. In other words, according to one aspect of the present invention, it is possible to efficiently cool the semiconductor components mounted on the downstream part of the air flow, by arrangement of the components without using an isolation member or the like.

With the above-described arrangement of the semiconductor components, the degree in which the cooling medium is heated during the flowing in the upstream part is lowered, and the temperature of the cooling medium at the positions directly in front of the semiconductor components at the downstream part is lower than the temperature in the conventional case. Accordingly, the cooling of the semiconductor components at the downstream part is promoted. In other words, the additional cooling ability obtained by a small sacrifice in the cooling of the semiconductor components at the upstream part is assigned to the cooling of the semiconductor components at the downstream part that have a tendency of being insufficiently cooled, so that the cooling of the semiconductor components at the downstream part is promoted.

In order to achieve the above object, according to another aspect of the present invention, the plurality of semiconductor components may be arranged on the circuit board so as to form a fresh cooling medium supplying passage at the upstream part of the flow of the cooling medium at an outer side of a region on which the semiconductor components are mounted, the semiconductor components not existing in the fresh cooling medium supplying passage, the cooling medium flowing in the fresh cooling medium supplying passage without contacting with the heat sinks.

The temperature of the cooling medium that passes through the fresh cooling medium supplying passage is not raised, so that it is possible to efficiently send the fresh cooling medium to the semiconductor components at the downstream part. Thereby, it is possible to promote the cooling of the semiconductor components at the downstream part.

In order to achieve the above object, according to another aspect of the present invention, the plurality of semiconductor components may be arranged on the circuit board such that a wide space part is formed between the semiconductor components mounted at the downstream part of the flow of the cooling medium and the semiconductor components mounted directly upstream of the semiconductor components mounted at the downstream part of the flow of the cooling medium. In this space part, the cooling medium temporarily stays (slower flow).

The cooling medium that comes from the upstream side is mixed with each other in the space part before the cooling medium flows in the heat sinks on the semiconductor components at the downstream part while contacting with these heat sinks to transfer heat from the heat sinks. By the mixing in the space part, the temperature of the cooling medium becomes uniform. Accordingly, the cooling of the semiconductor components at the downstream part is uniformly performed.

BEST MODE FOR CARRYING OUT THE INVENTION

Figure 1:
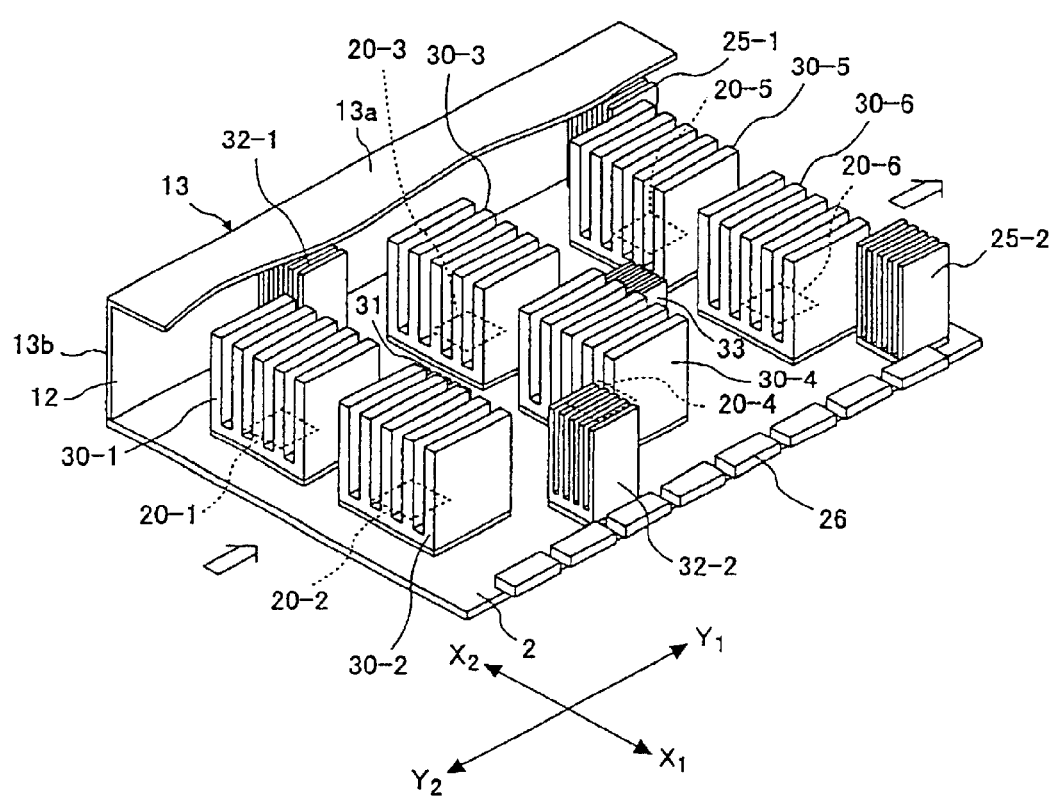
FIG. 1 is a perspective view showing a conventional electronics device unit with a part of a cover member being cut open.
Figure 2A:
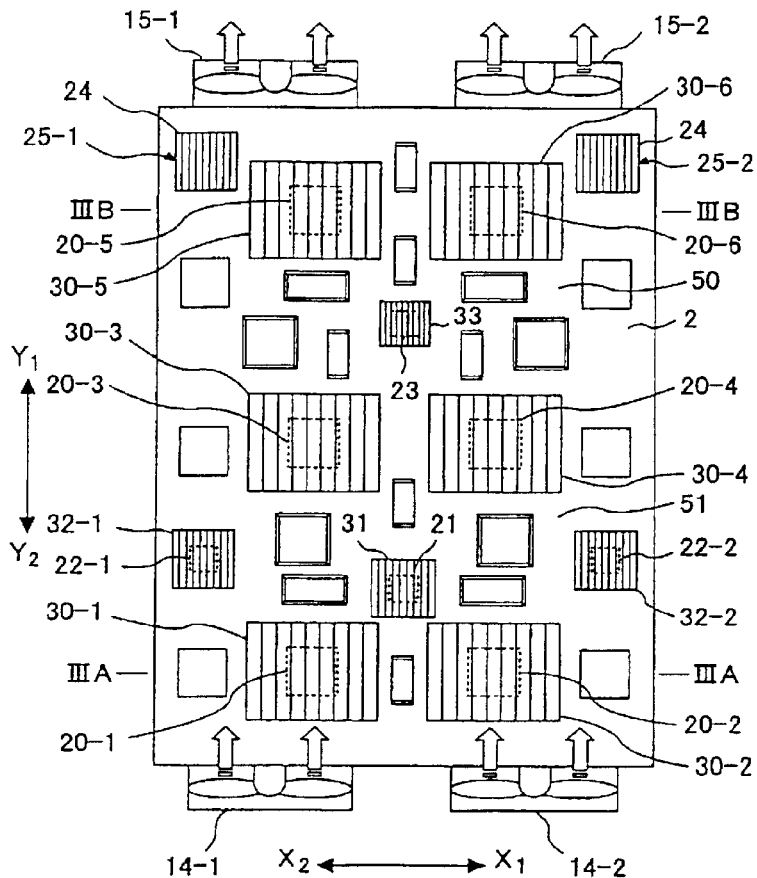
FIGS. 2A and 2B are a plan view and a side view of the electronics device unit of FIG. 1.
Figure 2B:
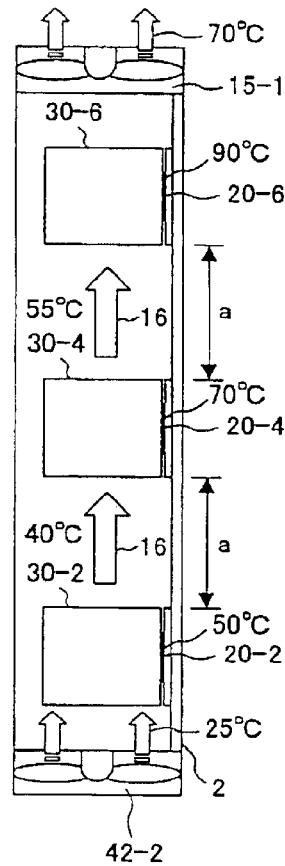
Figure 2C:
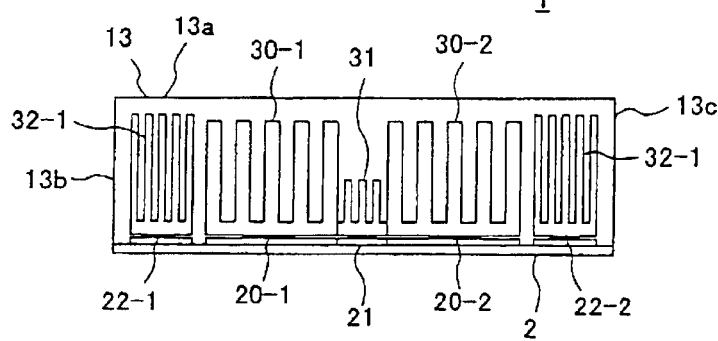
FIG. 2C is a view seen from a side from which air is sent into the electronics device unit of FIG. 1.
Figure 3A:
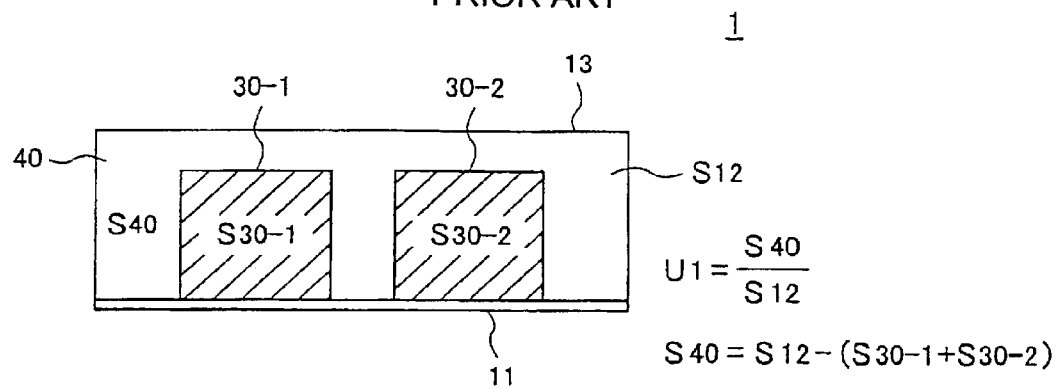
FIG. 3A is an illustration for an air flow passable sectional clearance ratio at the section taken along the IIIA—IIIA line of FIG. 2A.
Figure 3B:
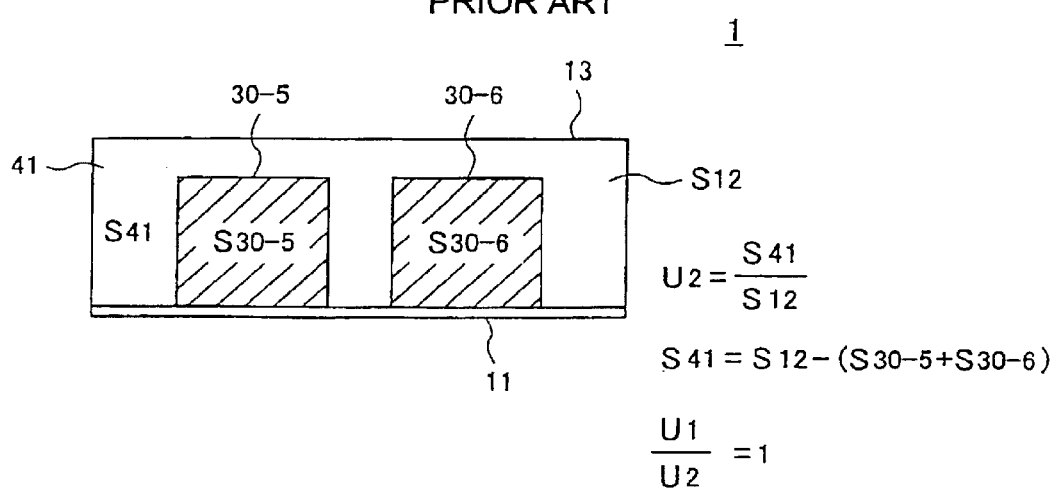
FIG. 3B is an illustration for an air flow passable sectional clearance ratio at the section taken along the IIIB—IIIB line of FIG. 2A.
Figure 4:
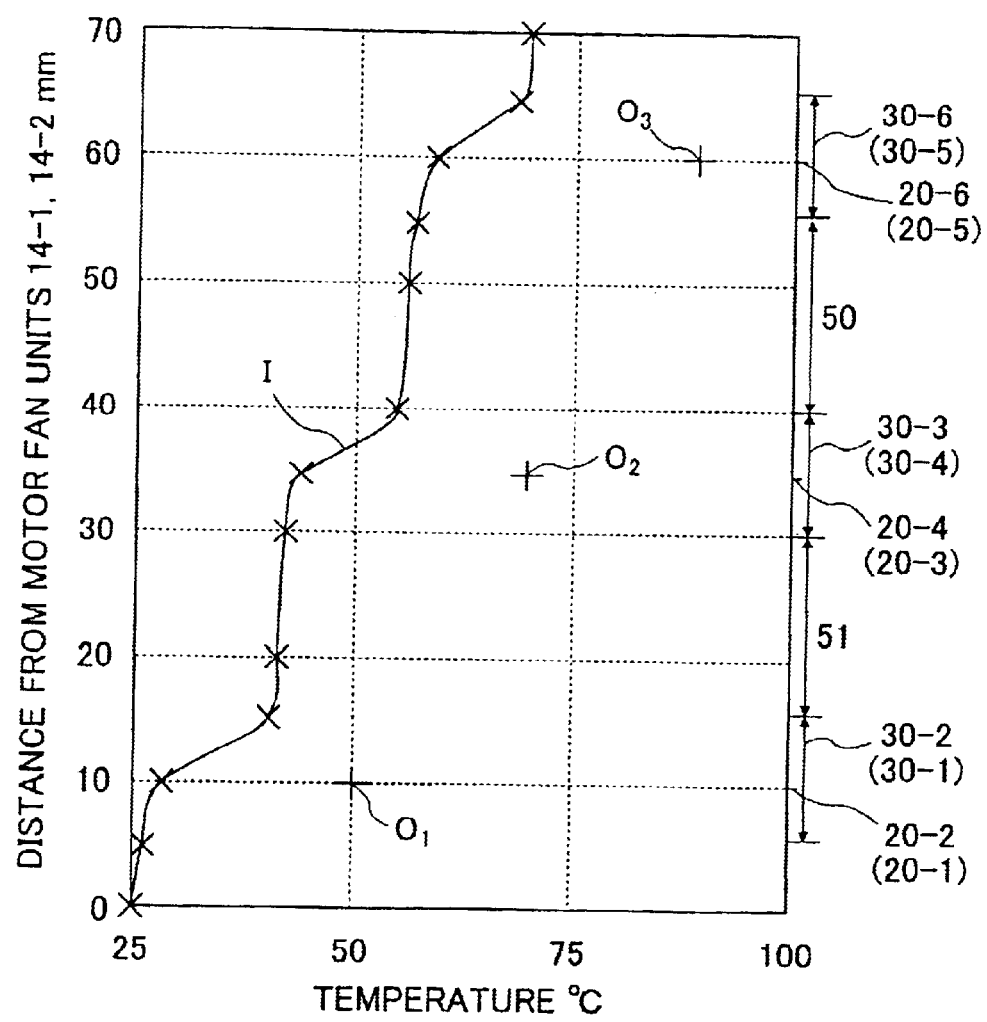
FIG. 4 shows forced draft cooling characteristics of the electronics device unit of FIG. 1.
Figure 5:
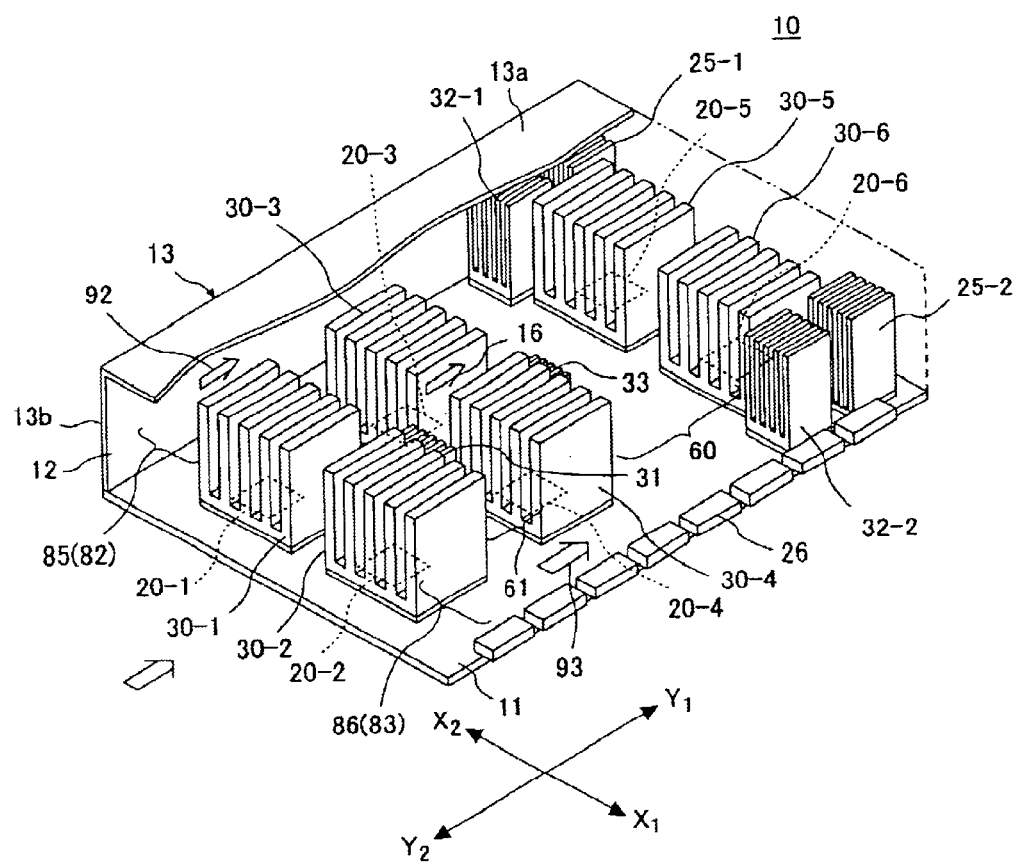
FIG. 5 is a perspective view showing an electronics device unit with a part of a cover member being cut open according to a first embodiment of the present invention.

Preferred embodiments of the present invention will be described with reference to the drawings. A basic structure of an electronics device unit in the following embodiments is substantially or partially the same as the structure of the above-described conventional electronics device unit. Accordingly, in the drawings corresponding to each following embodiment, the same reference numbers or symbols as those shown in FIGS. 1, 2A and 2B are attached to structural parts that are the same as those shown in FIGS. 1, 2A and 2B. Furthermore, the reference numbers having the additional numbers are attached to the structural parts in the following embodiments corresponding to the structural parts shown in FIGS. 1, 2A and 2B.

(First Embodiment)

FIGS. 5, 6A, 6B, and 6C show an electronics device unit 10 according to a first embodiment of the present invention. The electronics device unit 10 includes a rectangular circuit board 11 having an upper surface on which CPUs and so forth are mounted. The electronics device unit 10 further includes a cover member 13. This cover member 13 has a ceiling part 13a, and side plate parts 13b and 13c provided at both the sides of the electronics device unit 10 so as to form a tunnel 12. The electronics device unit 10 further includes motor fan units 14-1 and 14-2 that send air into the tunnel 12, and motor fan units 15-1 and 15-2 that discharge the air in the tunnel 12. The air flows from the Y2 direction side to the Y1 direction side as indicated by the arrow 16 to provide forced draft cooling to the CPUs and so forth. As for the air flow, the Y2 direction side is the upstream side, and the Y1 direction side is the downstream side. The Y1-Y2 directions are the longitudinal directions of the circuit board 11 and the electronics device unit 10. The X1-X2 directions are width directions of the circuit board 11 and the electronics device unit 10.

Six CPUs 20-1 through 20-6, one system control element 21, two memory control elements 22-1 and 22-2, and one clock control element 23, a plurality of memory cards 24, and the like are mounted on the upper surface of the circuit board 11. The memory cards 24 are arranged with the memory cards 24 standing, and constitute two memory card groups 25-1 and 25-2. A plurality of connectors 26 are arranged along one side of the circuit board 11. Heat sinks 30-1 through 30-6 are mounted on upper surfaces of the CPUs 20-1 through 20-6, respectively. Similarly, a heat sink 31 is mounted on an upper surface of the system control element 21, heat sinks 32-1 and 32-2 are mounted on the upper surfaces of the memory control elements 22-1 and 22-2, respectively, and a heat sink 33 is mounted on an upper surface of the clock control element 23. The heat sinks 30-1 through 30-6, 31, 32-1, 32-2, and 33 functions not only as members of releasing heat but also as members of blocking the air flow.

Arrangement of the CPUs 20-1 through 20-6, the system control element 21, the memory control elements 22-1 and 22-2, the clock control element 23, and the memory card groups 25-1 and 25-2 on the circuit board 11 will be described.

The CPUs 20-1 through 20-6 are arranged in two rows in the Y1-Y2 directions. The CPUs 20-1 and 20-2 are mounted at the upstream part, the CPUs 20-3 and 20-4 are mounted at the midstream part, and the CPUs 20-5 and 20-6 are mounted at the downstream part. The distance between the CPUs 20-1 and 20-2 at the upstream part and the CPUs 20-3 and 20-4 at the midstream part is "b", and the distance between the CPUs 20-3 and 20-4 at the midstream part and the CPUs 20-5 and 20-6 at the downstream part is "c". The distance "c" is about long 25 mm. Compared to the electronics device unit 1 shown in FIG. 1, the CPUs 20-3 and 20-4 at the midstream part are shifted in the Y2 direction such that the relation of c>b, c>a, and b<a is made. Accordingly, a space part 60 between the heat sinks 30-3 and 30-4 and the heat sinks 30-5 and 30-6 is about three times greater than a space part 61 between the heat sinks 30-1 and 30-2 and the heat sinks 30-3 and 30-4, and is greater than the corresponding space part 50 of the electronics device unit 1 shown in FIG. 1.

In the same manner as the electronics device unit 1 shown in FIG. 1, the system control element 21 is located at the center of the space part 61. In the same manner as the electronics device unit 1 shown in FIG. 1, the clock control element 23 is arranged in the space part 60 at the position near the heat sinks 30-3 and 30-4. In the same manner as the electronics device unit 1 shown in FIG. 1, the memory card groups 25-1 and 25-2 are arranged at the outer sides of the heat sinks 30-3 and 30-4 and at the positions near the end of the Y1 direction of the circuit board 11.

Different from the arrangement in the electronics device unit 1 shown in FIG. 1, the memory control elements 22-1 and 22-2 are arranged at the outer sides of the heat sinks 30-5 and 30-6.

Figure 6A:
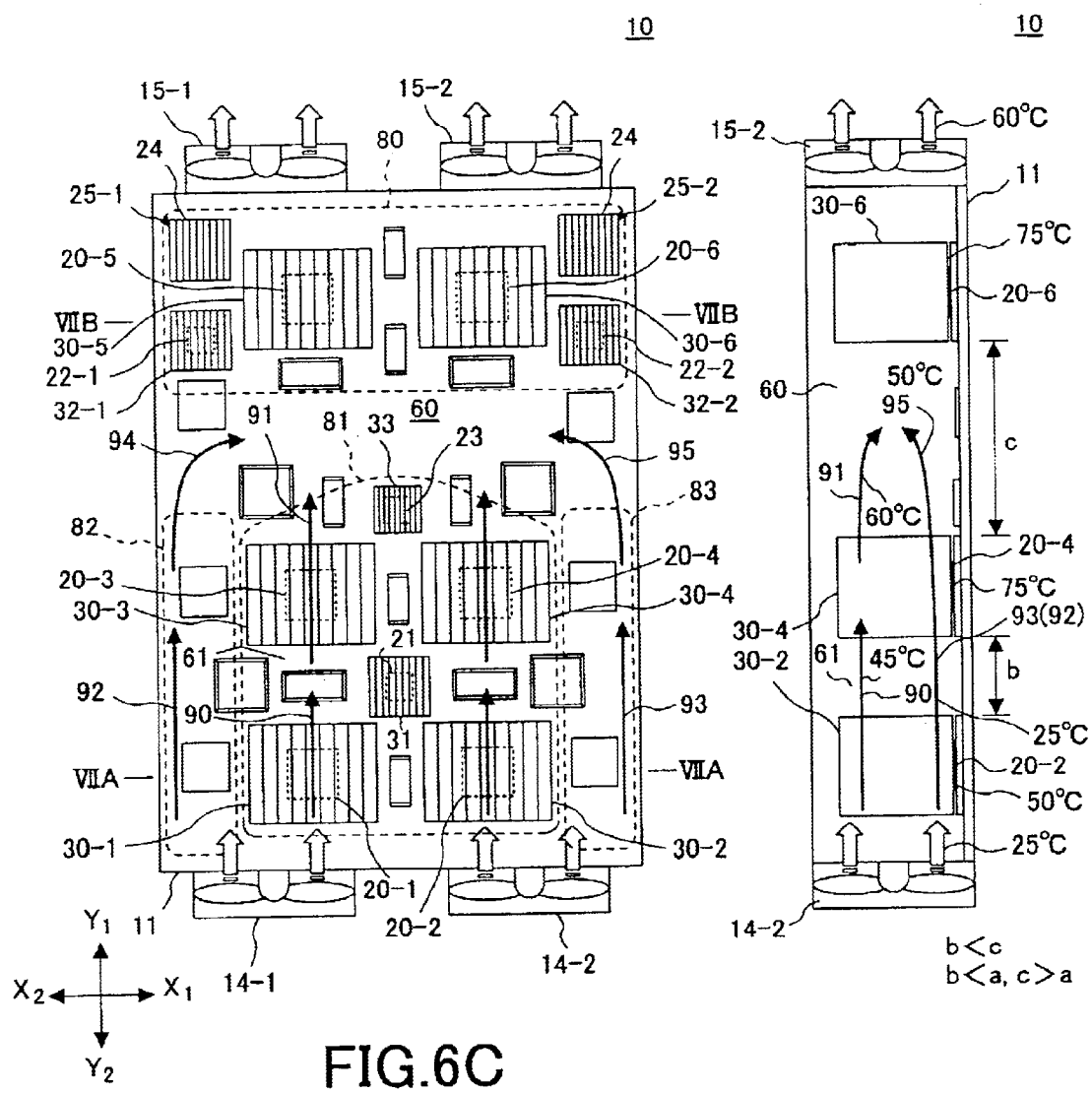
FIGS. 6A and 6B are a plan view and a side view, respectively, of the electronics device unit of FIG. 5.
Figure 7A:
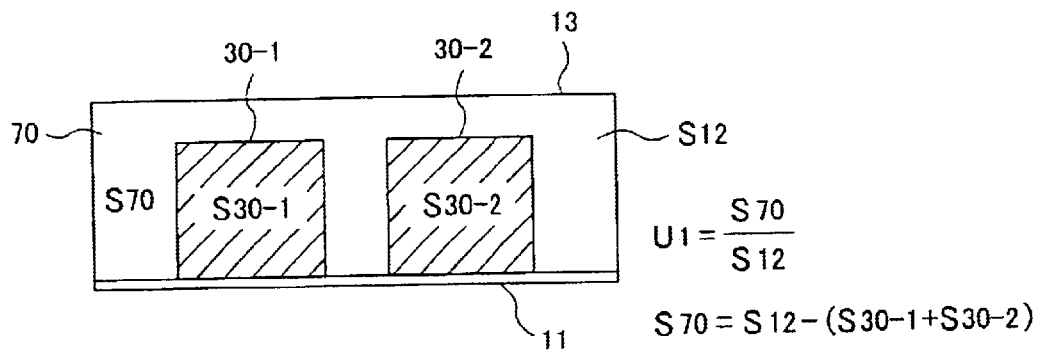
FIG. 7A is an illustration for an air flow passable sectional clearance ratio at the section taken along the VIIA—VIIA line of FIG. 6A.
Figure 7B:
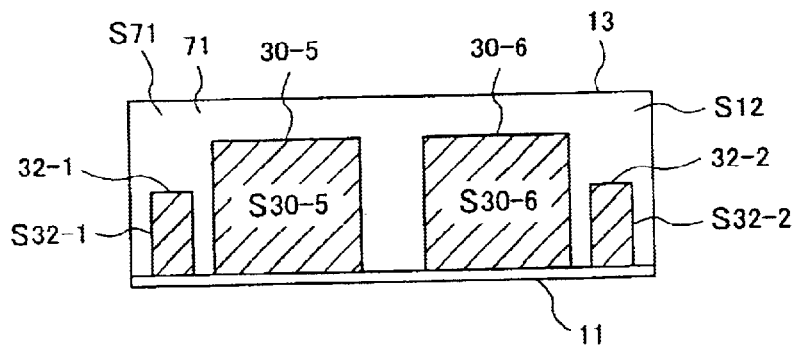
FIG. 7B is an illustration for an air flow passable sectional clearance ratio at the section taken along the VIIB—VIIB line of FIG. 6A.

FIG. 7A is a cross-sectional view taken along the line VIIA—VIIA of FIG. 6A, i.e., a section orthogonal to the air flow at the CPUs 20-1 and 20-2 at the upstream part. FIG. 7B is a cross-sectional view taken along the line VIIB—VIIB of FIG. 6A, i.e., a section orthogonal to the air flow at the CPUs 20-5 and 20-6 at the downstream part. The hatching indicates the parts in the tunnel 12 blocked by the heat sinks 30-1, 30-2, 30-5, 30-6, 32-1, and 32-2, respectively, and have the sectional areas S30-1, S30-2, S30-5, S30-6, S32-1, and S32-2, respectively. S12 indicates the sectional area of the tunnel 12. S70 indicates a sectional area of a clearance 70 between the cover member 13 and the heat sinks 30-1 and 30-2. That is, S70=S12−(S30-1+S30-2). S70 is equal to the corresponding sectional area S40 in the electronics device unit 1 shown in FIG. 1. S71 indicates a sectional area of a clearance 71 between the cover member 13 and the heat sinks 30-5, 30-6, 32-1, and 32-2. That is, S71=S12−(S30-5+S30-6+S32-1+S32-2).

As understood from FIGS. 7A and 7B, an air flow passable sectional clearance ratio U2 (S71/S12) at the downstream part is smaller than an air flow passable sectional clearance ratio U1 (S70/S12). That is, U1/U2≧1.2.

Figure 6B:
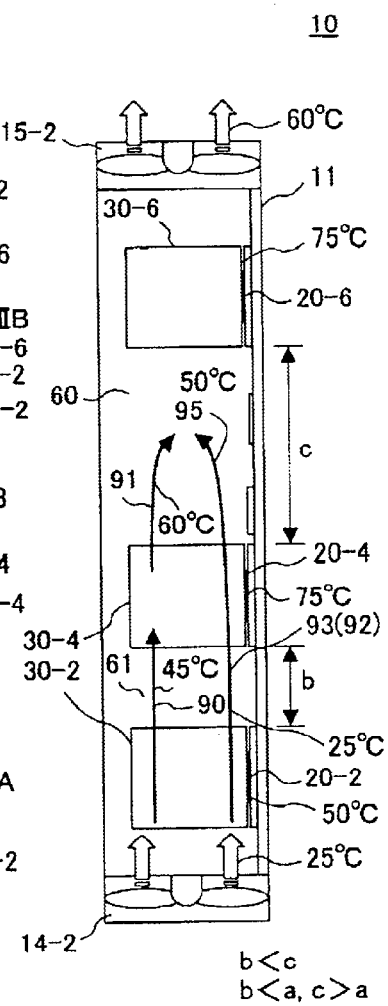
Figure 6C:
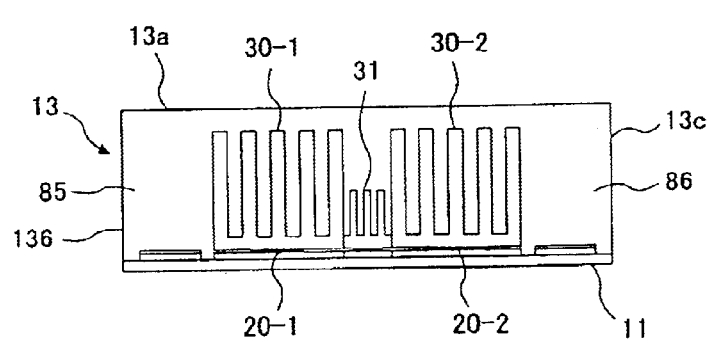
FIG. 6C is a view seen from a side from which air is sent into the electronics device unit of FIG. 5.

Furthermore, referring to FIGS. 6A and 6B, the reference number 80 designates a region having a large air flow resistance where the density of the mounted elements is high. This region 80 located at the downstream part spreads over the entire width of the circuit board 11. The reference number 81 designates a region having a large air flow resistance where the density of the mounted elements is high. The region 81 is located at the upstream part and the midstream part, and does not include both end parts of the width directions of the circuit board 11. At both the side parts of the width directions of the circuit board 11 at the upstream part and the midstream part, the heat sink does not exist, so that regions 82 and 83 having a low air flow resistance exist at both the side parts of the width directions of the circuit board 11.

These regions 82 and 83 form air flow passages, respectively in which fresh air flows.

The above-described electronics device unit 10 is electrically connected to other electronics device units via the connectors 26, a back panel board, and the like so as to configure a computer main body.

Next, forced draft cooling of the CPUs 20-1 through 20-6 will be described.

Air that is sent into the tunnel 12 by the motor fan units 14-1 and 14-2 flows in the tunnel 12 in the following manner while the air transfers heat from the heat sink 30-1 and so forth. The fresh air refers to the air that is sent into the tunnel 12 by the motor fan units 14-1 and 14-2 but that does not include the air whose temperature has been rapidly increased when the air sent into the tunnel 12 impacts the heat generating components.

As a first point, since the air flow passable sectional clearance ratio U1 at the upstream part is larger than the air flow passable sectional clearance ratio U2 at the downstream part, an amount of the air that flows in the upstream part and comes to the region in front of the heat sinks 30-5 and 30-6 without contacting with the heat sinks 30-1, 30-2, 30-3, and 30-4 is greater than the corresponding amount in the conventional case.

As a second point, the upstream side has the regions 82 and 83 having the low air flow resistance. Accordingly, at the upstream side, there are not only an air flow 91 that flows while contacting with the heat sinks 30-1 and 30-2, but also air flows 92 and 93 that flow in the regions 82 and 83 (the air flow passages 85 and 86) without contacting with the heat sinks.

Since the air that flows in the air flow passages 85 and 86 flows without contacting with the heat sinks, this air can flow with the temperature of this air not being raised, keeping the fresh air state until this air goes out of the air flow passages 85 and 86.

As a third point, at the downstream side, the region 80 having the high density of the mounted elements and the large air flow resistance spreads over the entire width of the circuit board 11. Accordingly, the fresh air that flows in the air flow passages 85 and 86 and comes to the region 80 with the temperature of this fresh air not being raised is efficiently sent into the space part 60 as indicated by the reference numbers 94 and 95 while the fresh air turns toward the center side of the circuit board 11.

As s fourth point, since the space part 60 is three times wider than the space part 61 at the upstream part, an amount of the fresh air that is sent into the space part 60 is also larger than an amount of the fresh air that is sent into the space part 61.

Therefore, the temperature of the air staying in the space part 60 is lowered.

As a fifth point, the air having the low temperature that stays in the space part 60 further flows while contacting with the heat sinks 30-5 and 30-6 to efficiently remove heat from the heat sinks 30-5 and 30-6.

The above first through fifth points are brought to the following conclusion. A part of the fresh air that is sent into the tunnel 12 by the motor fan units 14-1 and 14-2 is sent into the CPUs 20-5 and 20-6 at the downstream part having the serious cooling problem while this part of the fresh air remains in the fresh air state. In other words, the cooling of the CPUs 20-3 and 20-4 at the midstream part that still have a sufficient margin of a temperature is sacrificed to a certain degree (or a little) so that a limited amount of the air that is sent into the tunnel 12 by the motor fan units 14-1 and 14-2 can effectively serve the cooling of the CPUs 20-5 and 20-6 at the downstream part that are in the severe temperature state. In this manner, the forced draft cooling of the CPUs 20-5 and 20-6 at the downstream part can be promoted.

Figure 8:
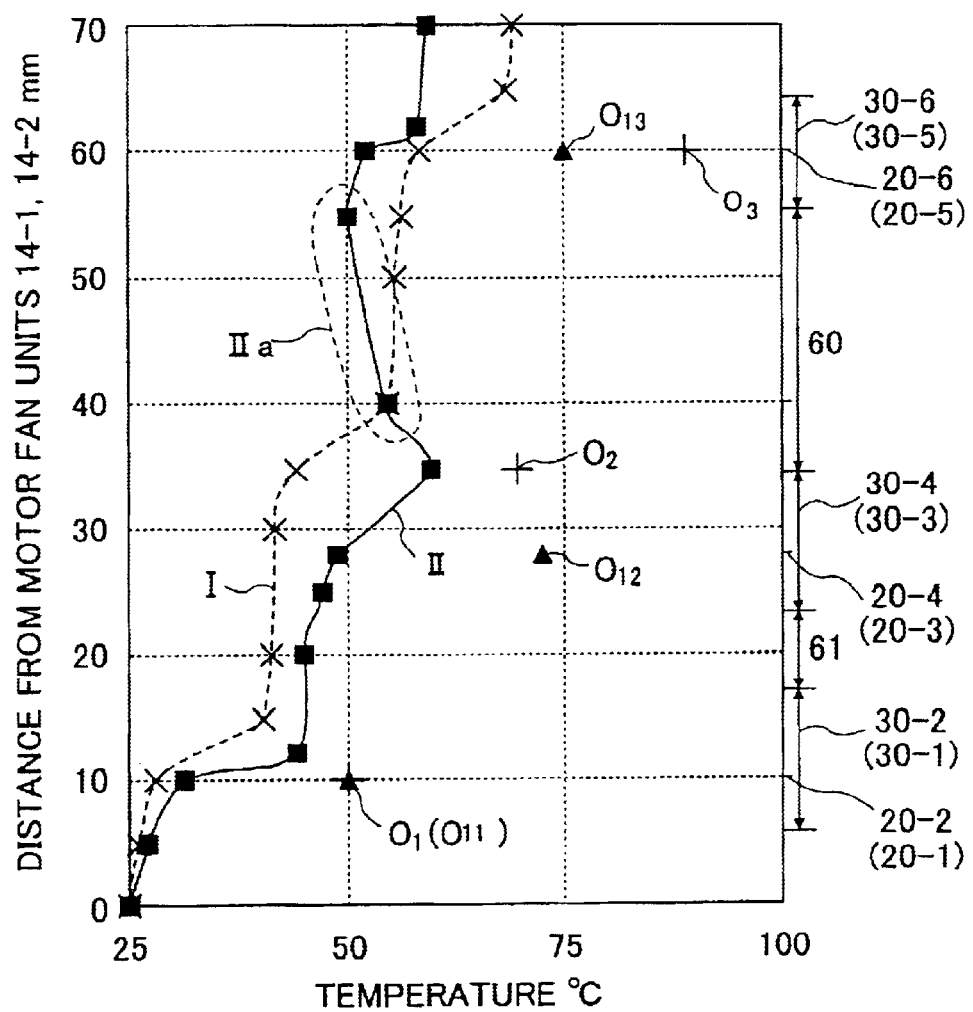
FIG. 8 shows forced draft cooling characteristics of the electronics device unit of FIG. 5.
Figure 9:
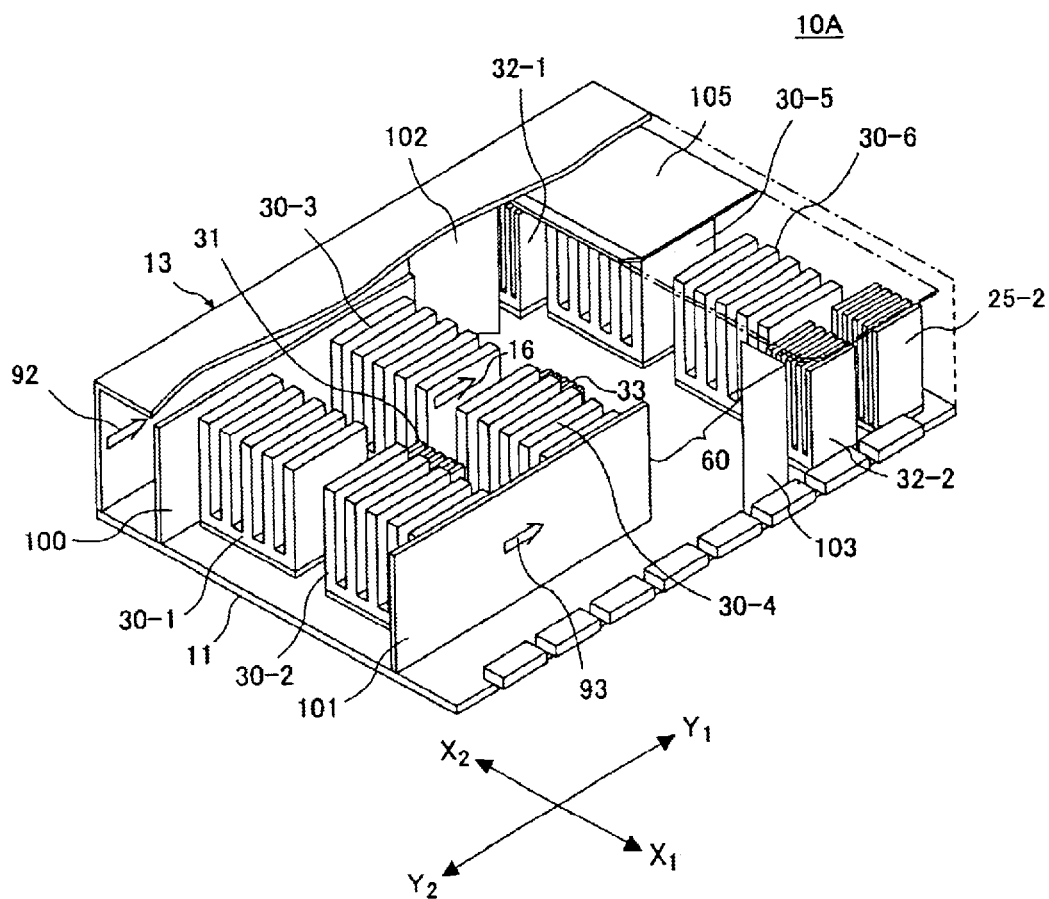
FIG. 9 is a perspective view showing an electronics device unit with a part of a cover member being cut open according to a second embodiment of the present invention.
Figure 10A:
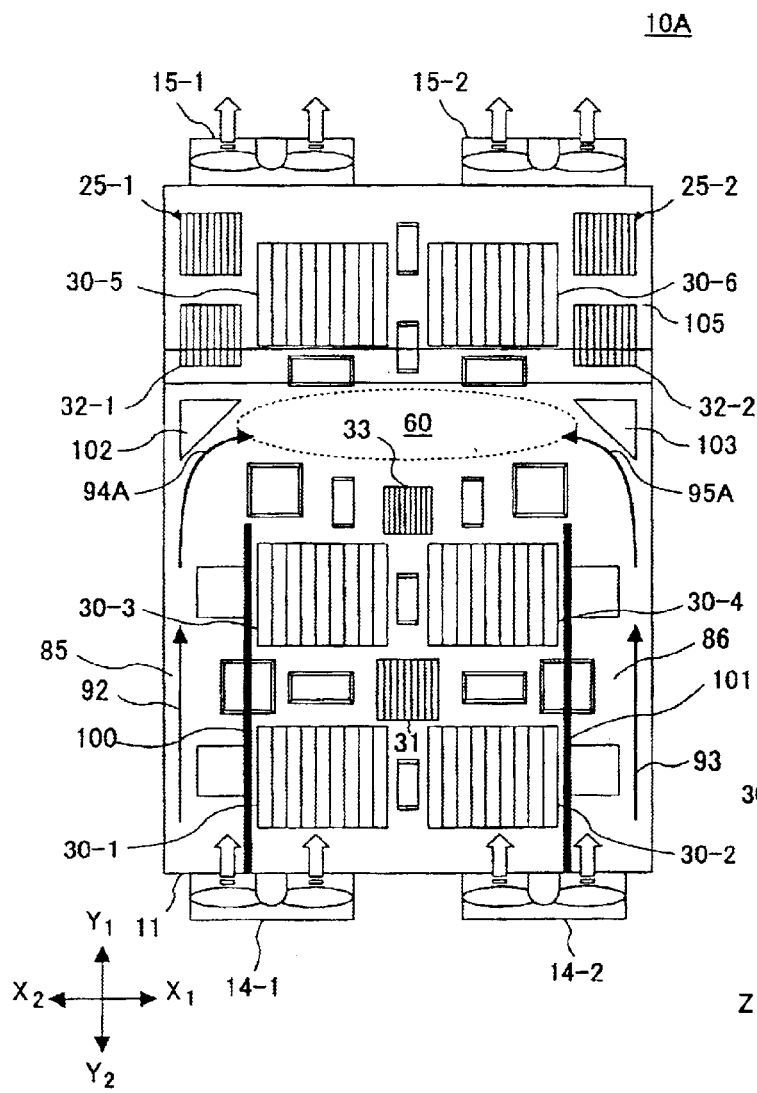
FIGS. 10A and 10B are a plan view and a side view, respectively, of the electronics device of FIG. 9.
Figure 10B:
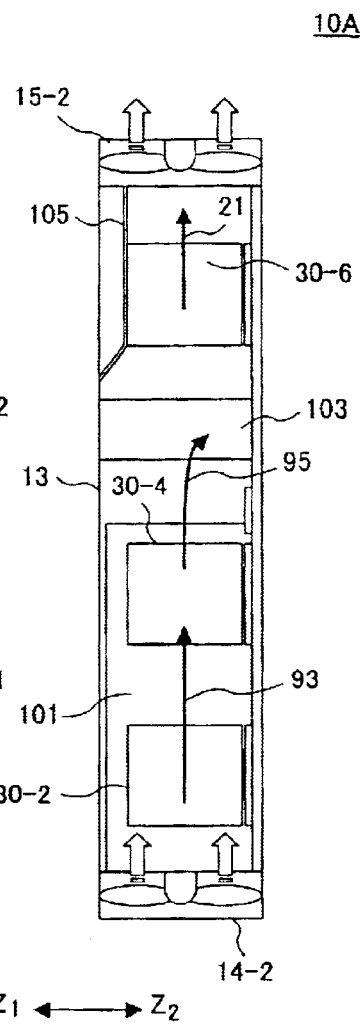
Figure 10C:
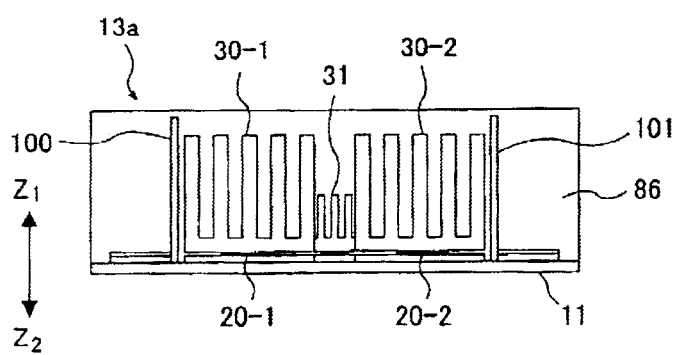
FIG. 10C is a view seen from a side from which air is sent into the electronics device unit of FIG. 9.

FIG. 8 shows a result of testing. Similar to the conventional testing example, this testing was performed under the condition in which a calorific value of each of the CPUs 20-1 through 20-6 was 100W, an intake air temperature was 25° C., and a wind speed of the inflow air was 2 m/s.

In FIG. 8, the vertical axis indicates the distance in the Y1 direction from the motor fan units 14-1 and 14-2, and the horizontal axis indicates the temperature. The air flows while transferring heat from the heat sinks 30-1 and so forth. In other words, the air flows while the air is heated by the hear sinks 30-1 and so forth, and a temperature of the air is raised.

As indicated by the (curved) line II and as shown in FIG. 6, after the air passes through the heat sinks 30-1 and 30-2 at the upstream part, the temperature of the air is raised to 45° C., and after the air passes through the heat sinks 30-3 and 30-4 at the midstream part, the temperature of the air is raised to 60° C. Not only the air flow 91 having the raised temperature of 60° C. that has passed through the heat sinks 30-3 and 30-4, but also the air flows 92 and 93 of the fresh air having the temperature of 25° C. that has passes through the regions 82 and 83 (the air flow passages 85 and 86) are sent into the space part 60. Accordingly, the temperature of the air in the space part 60 is a little lower than the temperature of the air flow that has passed the heat sinks 30-3 and 30-4, as indicated by the reference symbol IIa. In other words, the temperature of the air in the space part 60 becomes 50° C. That is, the air immediately before this air is sent into the heat sinks 30-5 and 30-6 at the downstream part has the temperature of 50° C. that is lower by as much as 5° C. than the temperature in the conventional case.

The air having the temperature of 50° C. passes through the heat sinks 30-5 and 30-6, so that this air transfers heat from the heat sinks 30-5 and 30-6, and the temperature of the air is raised to 60° C.

Therefore, in FIG. 8, as indicated by the point O11, the temperature of the CPUs 20-1 and 20-2 at the upstream part is 50° C. that is equal to the temperature in the conventional case. Furthermore, as indicated by the point O12, the temperature of the CPUs 20-3 and 20-4 at the midstream part is 75° C. that is higher by 5° C. than the temperature in the conventional case. However, the temperature of the CPUs 20-5 and 20-6 stays at 75° C. that is lower by as much as 15° C. than the temperature in the conventional case.

According to this embodiment of the present invention, the cooling of the CPUs 20-3 and 20-4 at the midstream part that has the sufficient temperature margin is sacrificed a little so that the cooling of the CPUs 20-5 and 20-6 at the downstream part whose temperature states become severe can be sufficiently better than the conventional cooling, and the cooling of the CPUs 20-5 and 20-6 can be promoted.

(Second Embodiment)

FIGS. 9, 10A, 10B, and 10C show an electronics device unit 10A according to a second embodiment of the present invention. The electronics device unit 10A is configured by adding the following structures to the electronics device unit 10 shown in FIGS. 5, 6A, 6B, and 6C. The added structures are provided for causing the fresh air to efficiently serve the cooling of the CPUs 20-5 and 20-6 at the downstream part.

As a first point, isolation plates 100 and 101 are provided for isolating the air flow passage 85 from the heat sinks 30-1 through 30-4 and isolating the air flow passage 86 from the heat sinks 30-1 through 30-4. By providing the isolation plates 100 and 101, while the fresh air flows in the air flow passages 85 and 86 in the Y1 direction, the leak of the fresh air from the air flow passages 85 and 86 into the region where the heat sinks 30-1 through 30-8 are arranged is restricted. Accordingly, while the fresh air flows in the air flow passages 85 and 86 in the Y1 direction, the fresh air is not wasted, and is sent into the space part 60.

As a second point, guide members 102 and 103 are provided. The guide members 102 and 103 are triangular prism members or plate members, and are provided at the side of the Y1 direction and at both the sides of the X1-X2 directions in the space part 60. That is, the guide members 102 and 103 are provided at the regions that face the air flow passages 85 and 86, respectively. The guide member 102 smoothly guides the air flow 92 to the center side of the space part 60 as indicated by the reference number 94A, and the guide member 103 smoothly guides the air flow 93 to the center side of the space part 60 as indicated the reference number 95A.

Therefore, the fresh air that has flowed in the air flow passages 85 and 86 is efficiently sent into the space part 60. As a result, the air staying in the space part 60 is efficiently stirred so that the temperature of the air in the space part 60 can be lowered.

As a third point, a throttling (reducing) member 105 is provided. This throttling member 105 is provided at the back surface side of the ceiling part 13a of the cover member 13 and at the region that faces the heat sinks 30-5 and 30-6 at the downstream part. By providing the throttling member 105, the sectional area at the heat sinks 30-5 and 30-6 is throttled (reduced) so as to be narrow.

Accordingly, at the heat sinks 30-5 and 30-6, the air flowing speed v becomes higher than the air flowing speed in the case where the throttling member 105 is not provided. Therefore, it is possible to more efficiently transfer heat from the heat sinks 30-5 and 30-6.

With the structures described in the above first, second, and third points, it is possible to promote the cooling of the CPUs 20-5 and 20-6 at the downstream part.

(Third Embodiment)

FIGS. 11, 12A, 12B, and 12C show an electronics device unit 10B according to a third embodiment of the present invention. The electronics device unit 10B is configured by adding a isolation member 110, and the guide members 102 and 103 to the electronics device member 10 shown in FIGS. 5, 6A, 6B, and 6C. This isolation member 110 is U-shaped when viewed from the top of the board.

The U-shaped isolation member 110 is fixed on the back surface of the ceiling part 13a of the cover member 13 so as to be provided at a narrow space between the ceiling part 13a of the cover member 13 and the heat sinks 30-1 through 30-6. The isolation member 110 includes an upstream side isolation plate part 110a that extends in the X1-X2 directions on the upper surfaces of the heat sinks 30-1 and 30-2. The isolation member 110 further includes a side isolation plate part 10b that extends in the Y1 direction (the air flow direction) from the one end of the upstream side isolation plate part 110a to an end of the cover member 13. The isolation member 110 further includes a side isolation plate part 110c that extends in the Y1 direction (the air flow direction) from the other end of the upstream side isolation plate part 110a to the end of the cover member 13. A flat space 112 surrounded and defined by the U-shaped isolation member 110 faces the upper surfaces of the heat sinks 30-1 and 30-2 at the upstream parts the upper surfaces of the heat sinks 30-3 and 30-4 at the midstream part, and the upper surfaces of the heat sinks 30-5 and 30-6 at the downstream part. In a state in which the electronics device unit 10B works, and the air flows in the tunnel 12 in the Y1 direction by the motor fan units 14-1, 14-2, 15-1, and 15-2, the air is not sent into the space 112, so that a pressure of the air in the space 112 becomes a little lower than a pressure of the air in the other parts of the tunnel 12 other than the space 112. Furthermore, in this state, the air flowing speed in the space 112 becomes lower than the air flowing speed in the other parts of the tunnel 12 other than the space 112. Accordingly, a part of the air having the raised temperature that flows in the heat sinks 30-1 and 30-2 at the upstream part, and the heat sinks 30-3 and 30-4 at the midstream part is attracted to the space 112, as indicated by the reference numbers 113 and 114 of FIG. 12B, and thereafter, the air flows in the space 112 in the Y1 direction as indicated by the reference number 115.

In this manner, the amount of the air that passes through the heat sinks 30-3 and 30-4 at the midstream part and flows into the space part 60 is decreased, so that the pressure of the air in the space part 60 is lowered. As a result, the amount of the fresh air that passes through the air flow passages 85 and 86 and flows into the space part 60 is increased, so that the temperature of the air temporarily staying in the space part 60 becomes lower than the temperature of the air staying in the space part 60 of the electronics device unit 10 shown in FIG. 5. Thereby, it is possible to further promote the cooling of the CPUs 20-5 and 20-6 at the downstream part.

The above-described U-shaped isolation member 110 has a function of decreasing a degree to which the heat discharged from the heat sinks 20-1 and 20-2 at the upstream part and the heat sinks 20-3 and 20-4 at the midstream part adversely affect the heat sinks 20-5 and 20-6 at the downstream part.

Figure 12A:
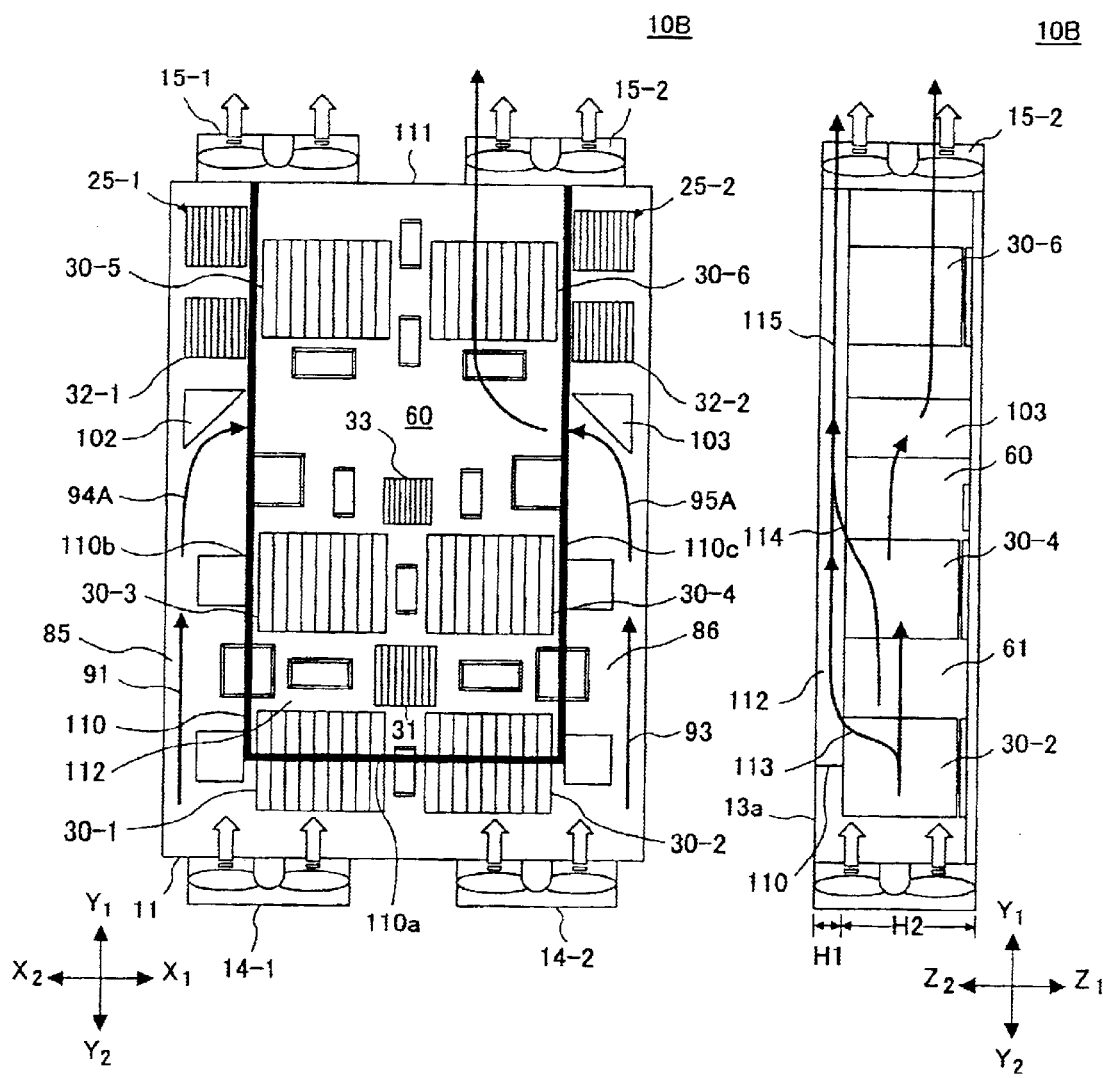
FIGS. 12A and 12B are a plan view and a side view, respectively, of the electronics device unit of FIG. 11.
Figure 12B:
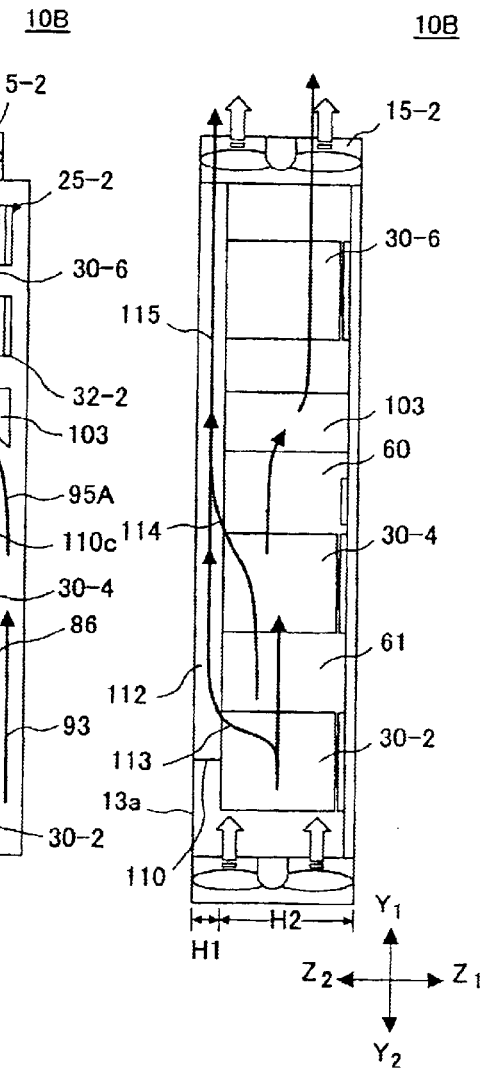
Figure 12C:
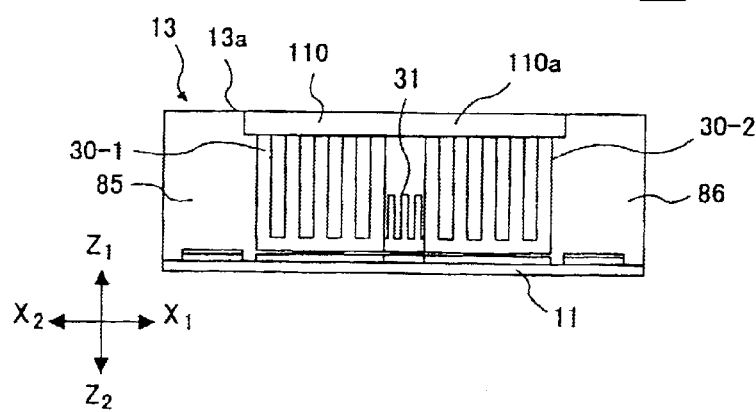
FIG. 12C is a view seen from a side from which air is sent into the electronics deice unit of FIG. 11.
Figure 13:
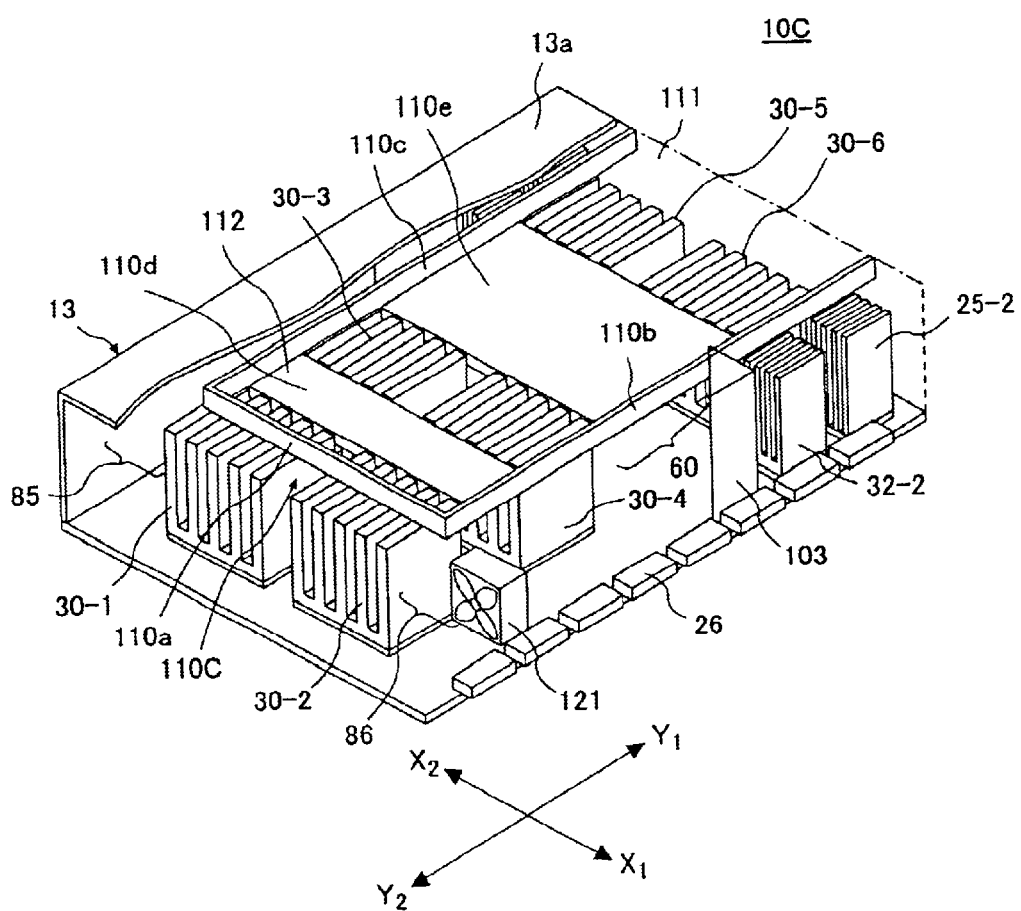
FIG. 13 is a perspective view showing an electronics device unit with a part of a cover member being cut open according to a fourth embodiment of the present invention.
Figure 14A:
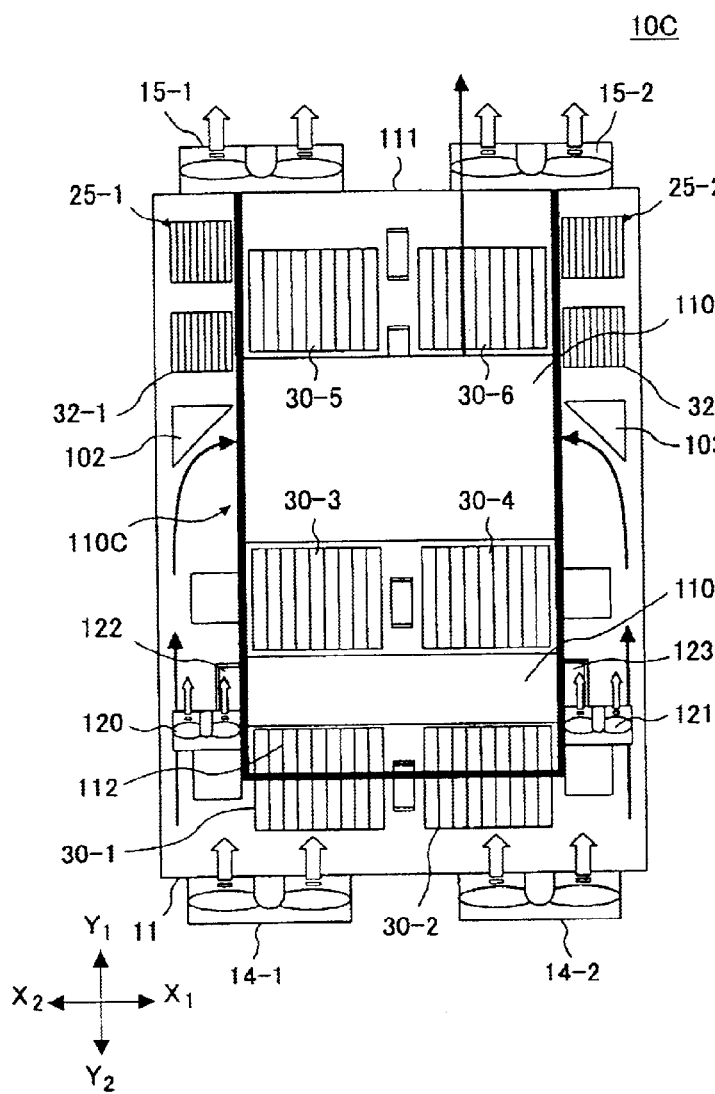
FIGS. 14A and 14B are a plan view and a side view, respectively, of the electronics device unit of FIG. 13.
Figure 14B:
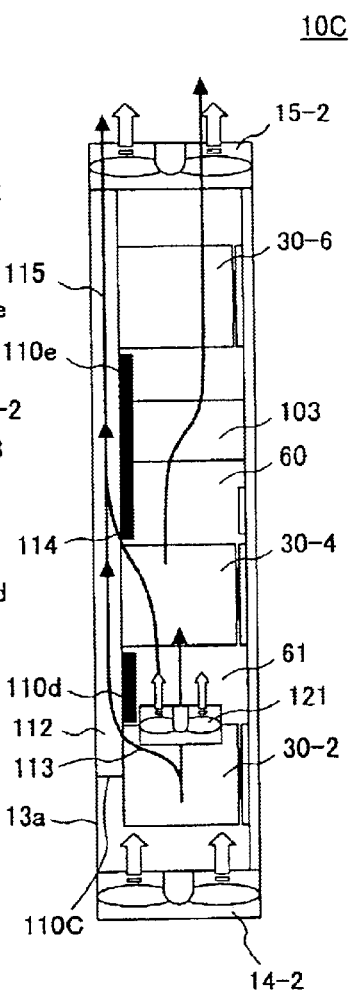
Figure 14C:
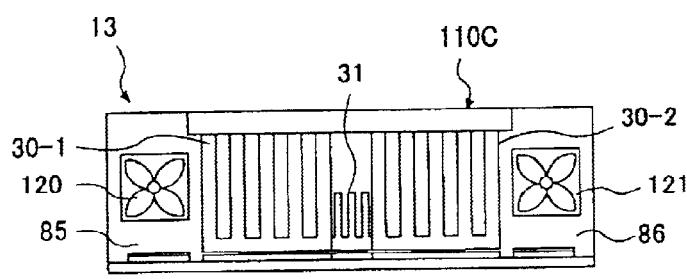
FIG. 14C is a view seen from a side from which air is sent into the electronics device of FIG. 13.

Furthermore, by properly setting a size of the cover member 13 and a size of the U-shaped isolation member 110, a ratio of the size H1 of FIG. 12B to the size H2 of FIG. 12B can be changed. Thereby, it is possible to properly determine or set the degree to which the pressure of the air in the space 112 is decreased from the pressure of the air in the other parts of the tunnel 12 other than the space 112. Thus, in accordance with the calorific values of the CPUs 20-1 through 20-6, the size of the cover member 13 and the size of the U-shaped isolation member 110 are properly set so that the cooling of the CPUs 20-5 and 20-6 at the downstream part can be optimized.

(Fourth Embodiment)

FIGS. 13, 14A, 14B, and 14C show an electronics device unit 10C according to a fourth embodiment of the present invention. The electronics device unit 10C is configured by replacing the U-shaped isolation member 110 of the electronics device unit 10B shown in FIG. 11 with a U-shaped isolation member 110C, and by adding motor fan units 120 and 121, and guide members 122 and 123 in the air flow passages 85 and 86, respectively to the electronics device unit 10B shown in FIG. 11.

Figure 11:
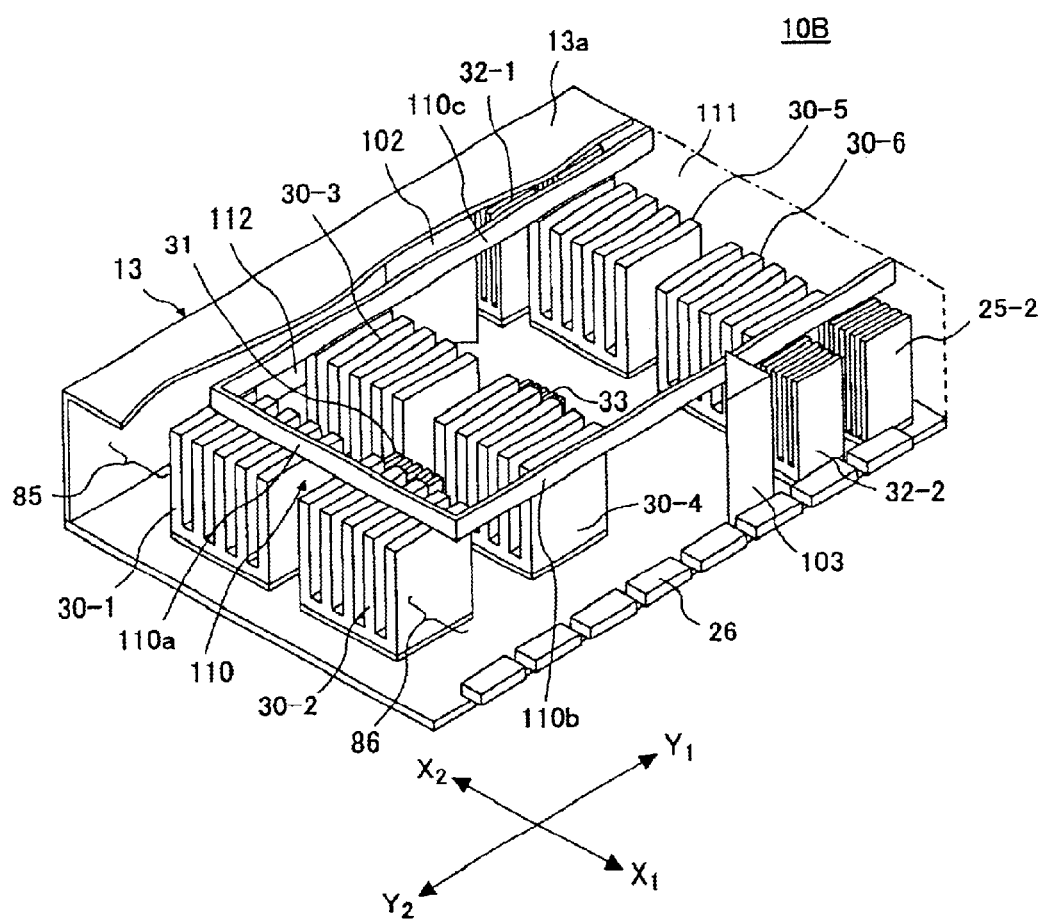
FIG. 11 is a perspective view showing an electronics device unit with a part of a cover member being cut open according to a third embodiment of the present invention.

The U-shaped isolation member 110C is configured by adding isolation ceiling parts 110d and 110e to the U-shaped isolation member 110 shown in FIG. 11. The isolation ceiling parts 110d and 110e extend between the side isolation plate parts 110b and 110c. The position levels (heights) of the isolation ceiling parts 110d and 110e are equal to the position levels of the top parts of the heat sinks 30-1 and so forth, and the isolation ceiling parts 110e and 110d shut the upper sides of the space parts 60 and 61, respectively.

By the isolation ceiling part 110e, the fresh air that passes through the air flow passages 85 and 86 and flows into the space part 60 can be prevented from going into the upper space 112 having the lower pressure of the air. Accordingly, the fresh air that flows into the space part 60 goes into the heat sinks 30-5 and 30-6 at the downstream part. In this manner, the CPUs 20-5 and 20-6 can be well cooled.

Similarly, by the isolation ceiling part 110d, the fresh air that passes through the air flow passages 85 and 86 and flows into the space part 61 can be prevented from going into the upper space 112, causing the fresh air to go into the heat sinks 30-3 and 30-4 at the midstream part.

Furthermore, by the working of the motor fan units 120 and 121, the amount of the fresh air that flows in the air flow passages 85 and 86 is increased, so that the amount of the fresh air that flows into the space part 60 is increased. In this manner, the CPUs 20-5 and 20-6 can be well cooled.

A part of the fresh air sent by the motor fan units 120 and 121 is guided by the guide members 122 and 123 so as to be sent into the space part 61. Accordingly, the amount of the fresh air that flows into the space part 61 is increased, so that the CPUs 20-3 and 20-4 can be well cooled.

(Fifth Embodiment)

Figure 15:
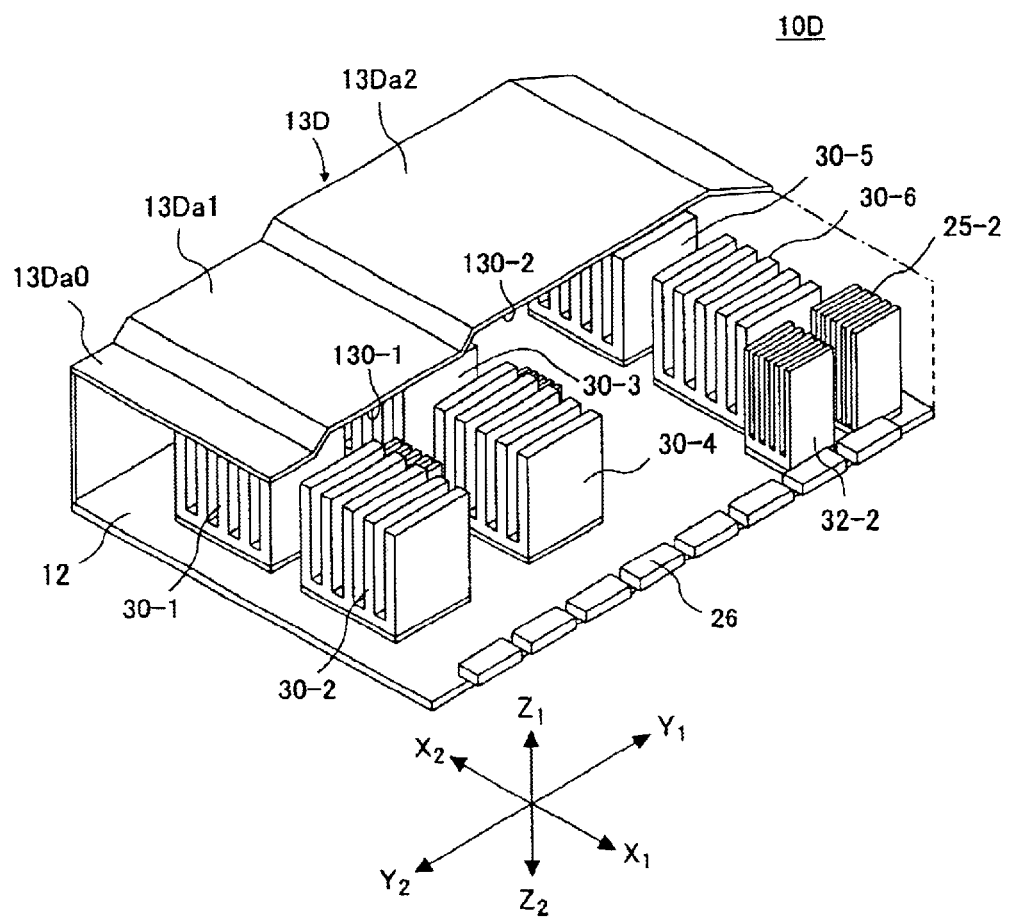
FIG. 15 is a perspective view showing an electronics device unit with a part of a cover member being cut open according to a fifth embodiment of the present invention.
Figure 16:
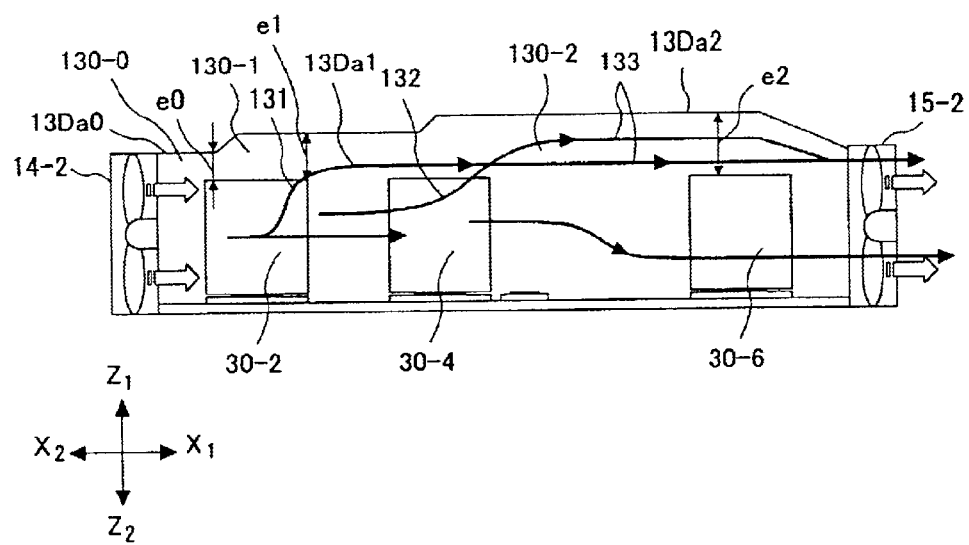
FIG. 16 is a side view of the electronics device unit of FIG. 15.

FIGS. 15 and 16 show an electronics device unit 10D according to a fifth embodiment of the present invention. The electronics device unit 10D includes a cover member 13D.

The cover member 13D includes a stepwise ceiling plate part 13Da. The stepwise ceiling plate part 13Da has the same function as the function of the U-shaped isolation member 110. The stepwise ceiling plate part 13Da includes a first step part 13Da1 having the level higher in the Z1 direction than the level of the upstream side part 13Da0. This Z1 direction is the direction up and away from the heat sinks 30-1 and so forth. This stepwise ceiling plate part 13Da further includes a second step part 13Da2 having the level higher in the Z1 direction than the level of the first step part 13Da1. The first step part 13Da1 faces the heat sinks 30-1 and 30-2 at the upstream part and the heat sinks 30-3 and 30-4 at the midstream part. The second step part 13Da2 faces the heat sinks 30-3 and 30-4 at the midstream part and the heat sinks 30-5 and 30-6 at the downstream part.

A flat space 130-0 having the thickness (height) e0 exists between the upstream side part 13Da0 and the heat sinks 13-1 and 13-2 at the upstream part. A flat space 130-1 having the thickness e1 that is greater than the thickness e0 exists between the first step part 13Da1 and the heat sinks 30-1 through 30-4. A flat space 130-2 having the thickness e2 that is greater than the thickness e1 exists between the second step part 13Da2 and the heat sinks 30-3 through 30-6.

In a state in which the above-described electronics device unit 10D is mounted on a server and operated, and air flows in the tunnel 12 in the Y1 direction by the motor fan units 14-1, 14-2, 15-1, and 15-2, it is hard for the air to be sent into the flat space 130-1 and 130-2. Moreover, in this state, pressures of the air in the flat spaces 130-1 and 130-2 becomes a little lower than the air in the other parts of the tunnel 12 other than the flat spaces 130-1 and 130-2, and the air flowing speed in the flat spaces 130-1 and 130-2 is lower than the air flowing speed in the other parts of the tunnel 12 other than the flat spaces 130-1 and 130-2. Accordingly, a part of the air having the raised temperature that flows in the heat sinks 30-1 and 30-2 at the upstream part and the heat sinks 30-3 and 30-4 at the midstream part to transfer heat from these heat sinks 30-1 through 30-4 is attracted to the side of the flat spaces 130-1 and 130-2 as indicated by the reference numbers 131 and 132. Thereafter, the attracted air flows in the flat spaces 130-1 and 130-2 in the Y1 direction.

As a result, the amount of the air that passes through the heat sinks 30-3 and 30-4, and flows into the space part 60 is decreased, so that the pressure of the air in the space part 60 is lowered. Therefore, the amount of the fresh air that passes through the air flow passages 85 and 86, and flows into the space part 60 is increased. Accordingly, the temperature of the air that temporarily stays in the space part 60 becomes lower than the temperature in the case of the electronics device units 10 shown in FIG. 5, so that the cooling of the CPUs 20-5 and 20-6 at the downstream part is promoted.

The first step part 13Da1 and the second step part 13Da2 have the function of reducing the degree to which the heat generated by the heat sinks 30-1 and 30-2 at the upstream part and the heat sinks 30-3 and 30-4 at the midstream part adversely affect the heat sinks 30-5 and 30-6 at the downstream part. Different from the electronics device unit 10B shown in FIG. 11, the electronics device unit 10D does not have a special member such as the U-shaped isolation member 110.

(Sixth Embodiment)

FIGS. 17 and 18A through 18D show an electronics device unit 10E according to a sixth embodiment of the present invention. FIG. 18E is a cross-sectional view taken along the line D—D of the FIG. 18A. Eight CPUs 20-11 through 20-18 are arranged in two rows in the Y1-Y2 directions on the circuit board 11. These eight CUPs 20-11 through 20-18 include the CPUs 20-11 and 20-12 at the upstream part, the CPUs 20-13 and 20-14 at the midstream, the CPUs 20-15 and 20-16 at the midstream part, and the CPUs 20-17 and 20-18 at the downstream part. Heat sinks 30-11 through 30-18 are mounted on the CPUs 20-11 through 20-18, respectively.

The heat sinks 30-11 through 30-18 are arranged in the two rows in the Y1-Y2 directions, and are arranged in four columns in the X1-X2 directions.

First, the arrangement in the Y1-Y2 directions will be described. A space part 140 exists between the heat sinks 30-11 and 30-12 at the upstream part and the next heat sinks 30-13 and 30-14 at the midstream part, a space part 141 exists between the heat sinks 30-13 and 30-14 and the next heat sinks 30-15 and 30-16, and a space part 142 exists between the heat sinks 30-15 and 30-16 and the heat sinks 30-17 and 30-18 at the downstream part. The space part 140 has the size f1 in the Y1-Y2 directions, the space part 141 has the size f2 in the Y1-Y2 directions, and the space part 143 has the size f3 in the Y1-Y2 directions. These sizes have the relation of f1<f2<f3. As the space part is positioned at the more downstream side, the size of the space part becomes greater. The size f2 is two times greater than the size f1, and the size f3 is two times greater than the size f2.

Accordingly, as the space part is positioned at the more downstream side, the amount of the fresh air that flows in the air flow passages 85 and 86 and flows into the space parts 140, 141, and 142 becomes greater. As a result, as the CPUs 20-11 through 20-18 are positioned at the more downstream side, the cooling of the CPUs becomes more efficient compared to the conventional case.

Next, the arrangement in the X1-X2 directions will be described. Two heat sinks 30-11 and 30-12 at the upstream part are arranged near the center line 145. The heat sinks 30-13 and 30-14 are arranged so as to be shifted to the outer side by the distances g1 from the heat sinks 30-11 and 30-12, respectively, in terms of the X1-X2 directions. The heat sinks 30-15 and 30-16 at the next midstream part are arranged so as to be shifted to the outer side by the distances g2 from the heat sinks 30-13 and 30-14, respectively, in terms of the X1-X2 directions. Two heat sinks 30-17 and 30-18 at the downstream part are arranged so as to be shifted to the outer side by the distances g3 from the heat sinks 30-15 and 30-16, respectively, in terms of the X1-X2 directions.

With this arrangement, the fresh air that flows in the air flow passages 85 and 86 located at both the sides directly impacts a part of each of the heat sinks 30-13 through 30-18, so that the cooling of the CPUs 20-13 through 20-18 is promoted. The shifted distances g1, g2, and g3 have the relation of g1<g2<g3. In other words, as the heat sinks 30-11 through 30-18 are positioned at the more downstream side, the shifted distance becomes greater. The shifted distance g2 is two times greater than the shifted distance g1, and the shifted distance g3 is two times greater than the shifted distance g2.

Accordingly, as the heat sinks 30-13 through 30-18 are positioned at the more downstream side, the amount of the fresh air that flows in the air flow passages 85 and 86 and directly impacts the heat sinks 30-13 through 30-18 becomes greater. Therefore, as the CPUs 20-13 through 20-18 are positioned at the more downstream side, the cooling of the CPUs becomes more efficient. Particularly, the heat sinks 30-17 and 30-18 at the downstream part approximately face the exits of the air flow passages 85 and 86, so that almost all of the fresh air that flows in the air flow passages 85 and 86 directly impacts the heat sinks 30-17 and 30-18 at the downstream part, and passes through the heat sinks 30-17 and 30-18 as indicated by the reference number 150. As a result, the cooling of particularly the CPUs 20-17 and 20-18 at the downstream part is promoted.

Figure 17:
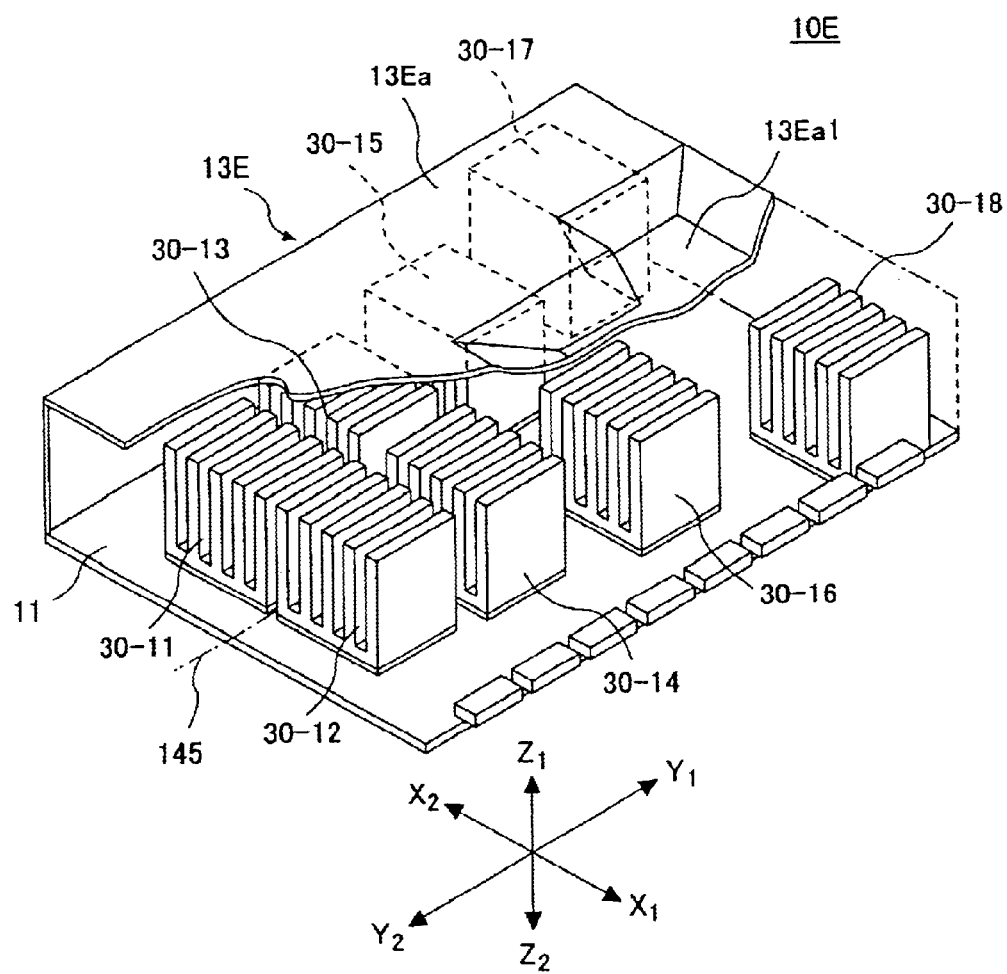
FIG. 17 is a perspective view showing an electronics device unit with a part of a cover member being cut open according to a sixth embodiment of the present invention.
Figure 18A:
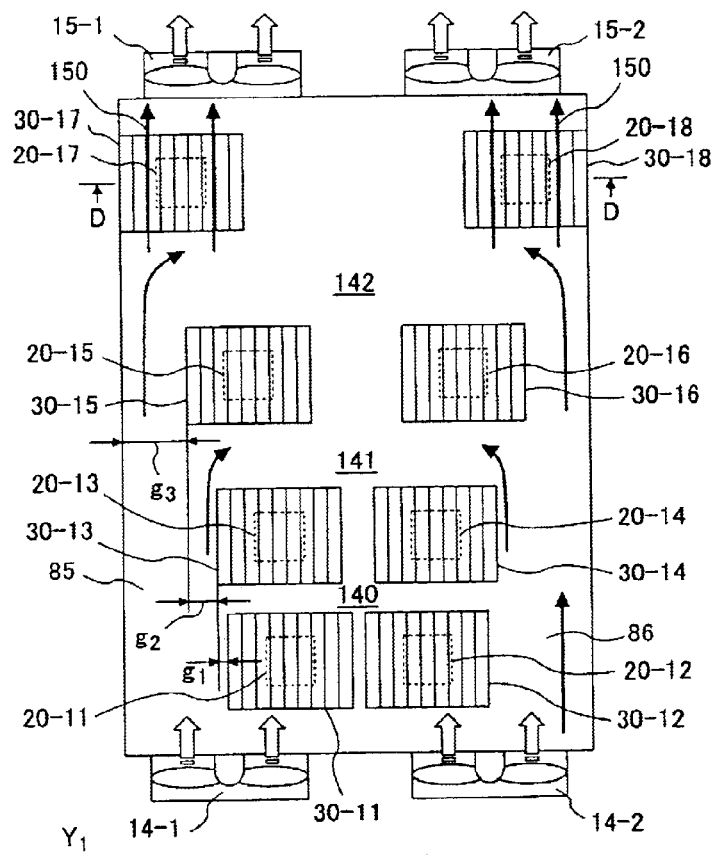
FIGS. 18A and 18B are a plan view and a side view, respectively, of the electronics device unit of FIG. 17.
Figure 18B:
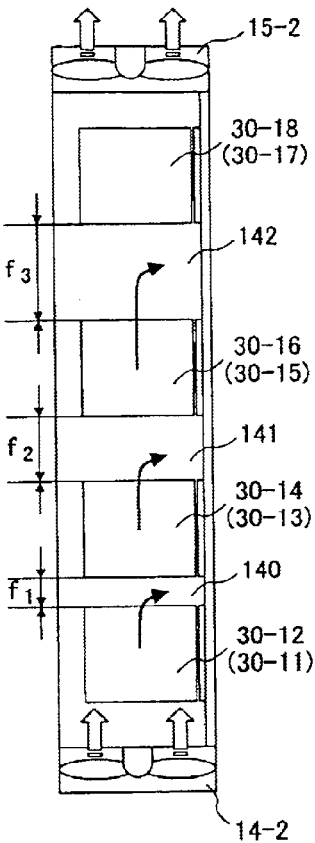
Figure 18C:
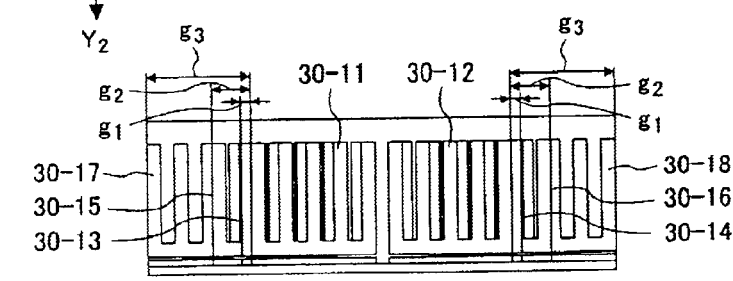
FIG. 18C is a view seen from a side from which air is sent into the electronics device unit of FIG. 17.
Figure 18D:
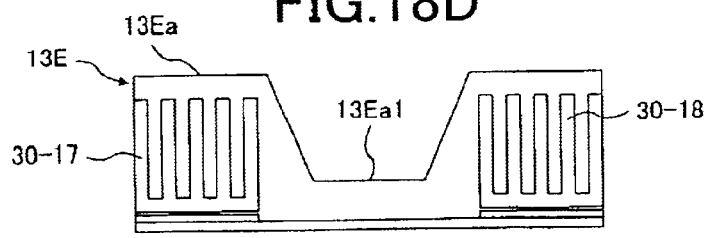
FIG. 18D is a cross-sectional view taken along the line D—D of FIG. 18A.

Furthermore, as shown in FIGS. 17 and 18D, a throttling part 13Ea1 that protrudes between the heat sinks 30-17 and 30-18 at the downstream part is formed on the ceiling plate part 13Ea of the cover member 13E. Accordingly, it becomes hard for air to pass through the part between the heat sinks 30-17 and 30-18. To the degree that it becomes difficult for the air to pass through this part between the heat sinks 30-17 and 30-18, the amount of the air that passes through the heat sinks 30-17 and 30-18 becomes greater, so that the cooling of the CPUs 20-17 and 20-18 is further promoted.

(Seventh Embodiment)

Figure 19:
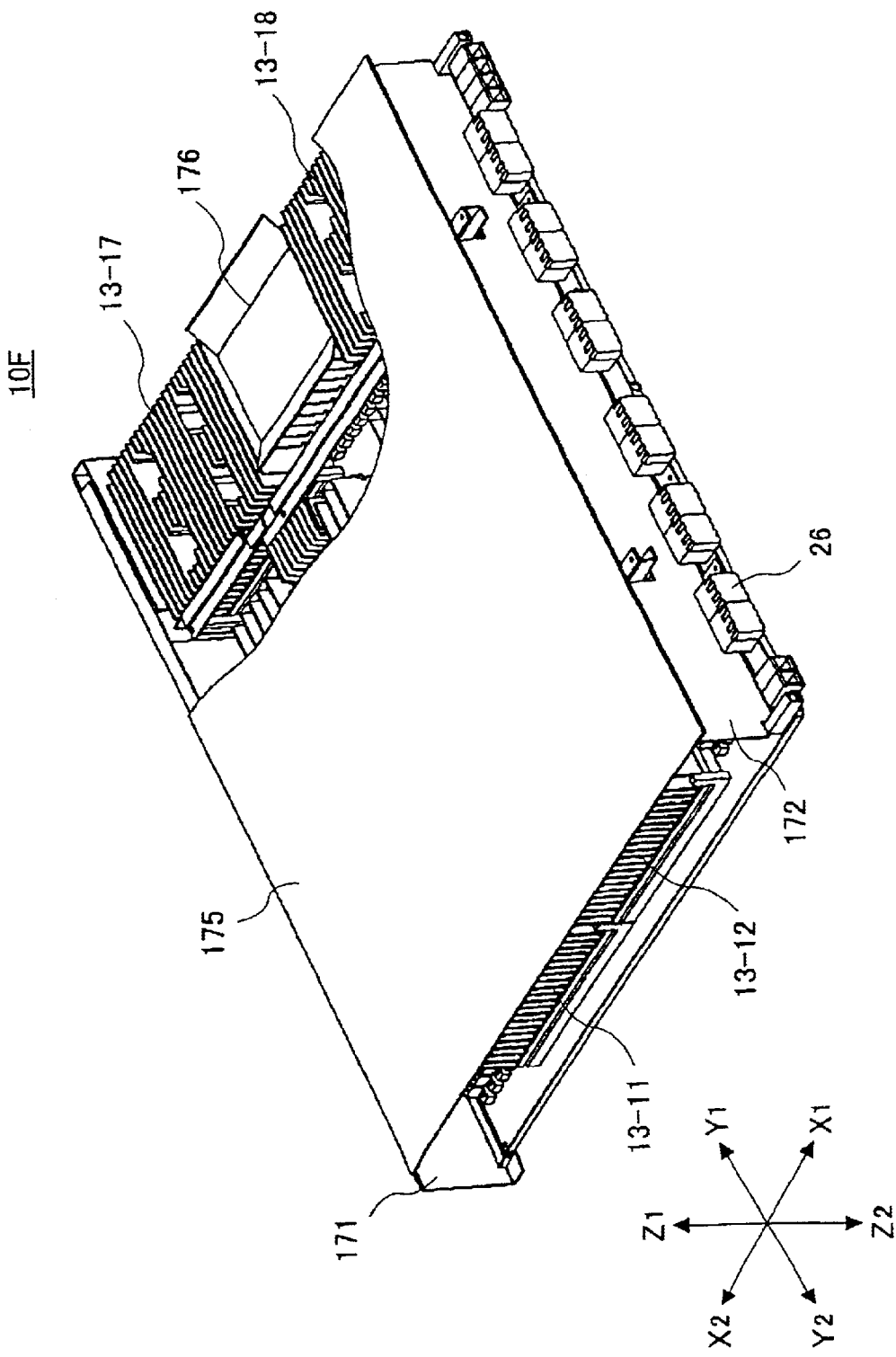
FIG. 19 is a perspective view showing an electronics device unit with a part of a cover member being cut open according to a seventh embodiment of the present invention.
Figure 20:
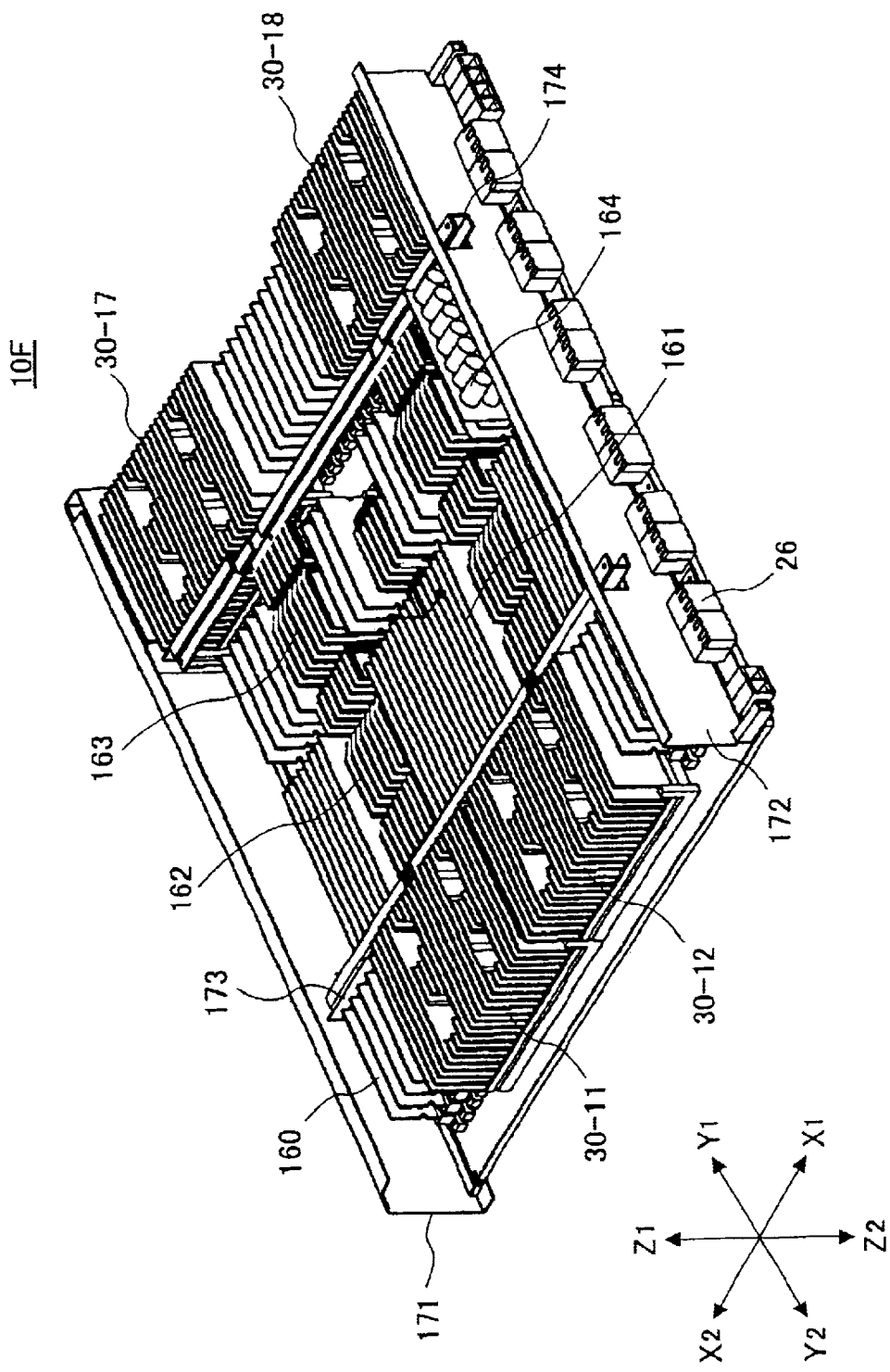
FIG. 20 is a perspective view showing the electronics device unit of FIG. 19 with a ceiling plate member being removed.

FIGS. 19 and 20 show an electronics device unit 10F according to a seventh embodiment of the present invention. FIG. 20 shows the electronics device unit 10F with the ceiling plate member shown in FIG. 19 being removed. The electronics device unit 10F is the actual product that has been designed based on the electronics device unit 10E of the sixth embodiment of the present invention.

In FIGS. 19 and 20, the same reference numbers of FIG. 17 are attached to the structural elements corresponding to those of FIG. 17. Two heat sinks 30-11 and 30-12 at the upstream part are arranged near the center line 145, and two heat sinks 30-17 and 30-18 at the downstream part are arranged so as to be shifted to the outer side in terms of the X1-X2 directions by the maximum distance from the heat sinks 30-11 and 30-12, respectively. The reference number 160 designates a module, and the modules 160 are mounted at the outer sides of the heat sinks 30-11 and 30-12. The reference number 161 designates a memory card, and the memory card 161 is mounted directly downstream of the heat sinks 30-11 and 30-12. The reference number 162 designates a heat sink for cooling the control element, and the heat sinks 162 are mounted at both the sides of the memory card 161 in terms of the X1-X2 directions. The reference number 163 designates a heat sink for cooling the system control element, and the heat sinks 163 are mounted directly downstream of the heat sinks 162, respectively. The heat sink 163 for cooling the system control element has the height greater than the height of the heat sink 162 for cooling the control element. The reference number 164 designates a passive component.

In this embodiment, the cover member 13E shown in FIG. 17 includes the side isolation plates 171 and 172 at both the sides of the cover member 13E, mechanism components 173 and 174 that extend in the X1-X2 directions between the side isolation plates 171 and 172, the ceiling plate part 175 that covers the part between the side isolation plates 171 and 172 at both the sides of the cover member 13E, and the throttling plate member 176 that corresponds to the throttling part 13Ea1.

The air that enters the air flow passages located at the outer sides of the heat sinks 30-11 and 30-12, respectively flows in the Y1 direction, and impacts the heat sinks 30-17 and 30-18 at the downstream part to efficiently transfer heat from the heat sinks 30-17 and 30-18. Accordingly, the forced draft cooling of the CPUs located at the downstream part is promoted.

(Eighth Embodiment)

Figure 21:
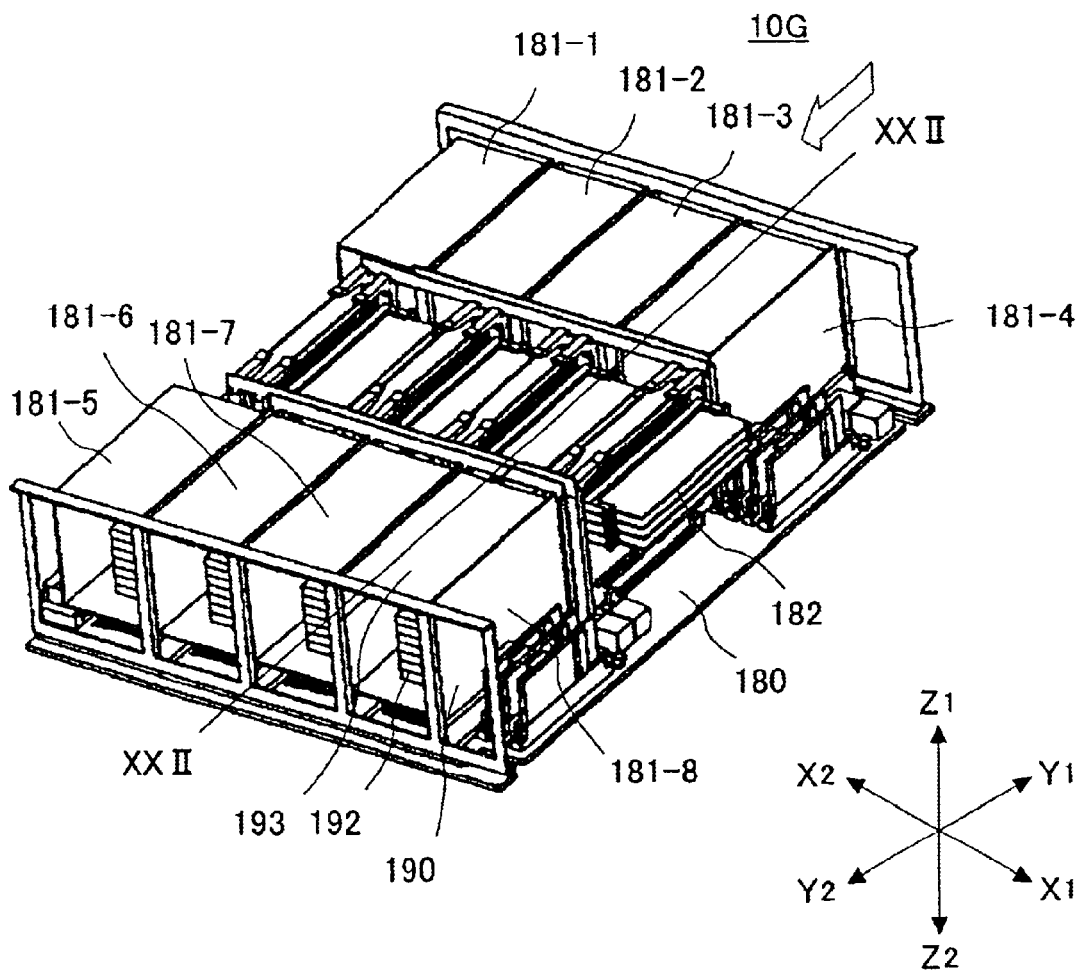
FIG. 21 is a perspective view showing an electronics device unit with a cover member being removed according to an eighth embodiment of the present invention.
Figure 22:
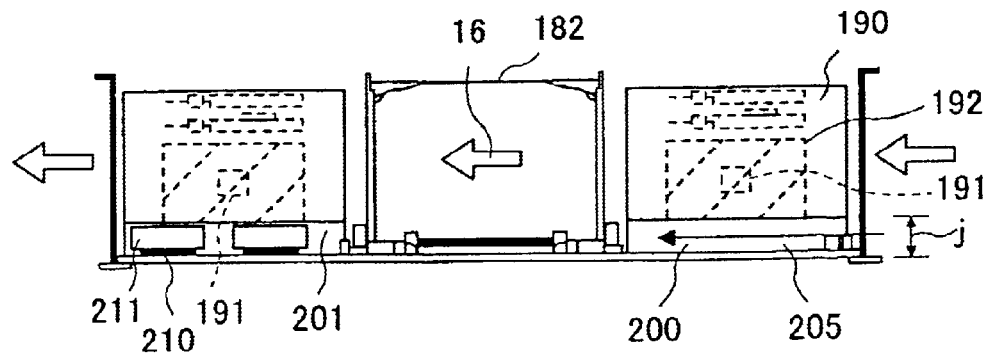
FIG. 22 is a cross-sectional view taken along the line XXII—XXII of FIG. 21.

FIGS. 21 and 22 show an electronics device unit 10G according to an eighth embodiment of the present invention. In FIGS. 21 and 22, the cover member that forms the tunnel is removed. FIG. 22 is a cross-sectional view taken along the line XXII—XXII of FIG. 21.

In FIGS. 21 and 22 of this embodiment, the air flows into the electronics device unit 10G from the Y1 direction side. The air flows inside the electronics device unit 10G in the Y2 direction. The electronics device unit 10G has the following structure. Four CPU modules 181-1 through 181-4 are mounted at the end (the upstream side of the air flow) of the circuit board 180 in terms of the Y1 direction. Four CPU modules 181-5 through 181-8 are mounted at the end (the downstream side of the air flow) of the circuit board 180 in terms of the Y2 direction. A plurality of memory card modules 182 are mounted at the center part of the circuit board 180.

CPUs 191 are respectively attached to the side surfaces of vertical circuit boards 190 corresponding to the CPU modules 181-1 through 181-8, respectively. A heat sink 192 is mounted on this CPU 191, and a U-shaped cover member 193 is provided so as to cover the heat sink 192.

In each of the CPU modules 181-1 through 181-8, a connector provided at the lower side of the vertically standing circuit board 190 is connected to a connector of the circuit board 180. In this manner, these CPU modules are arranged in the X1-X2 directions and mounted on the circuit board 180. The cover members 193 are separated from the circuit board 180 such that a space part 200 having the height j is formed between the CPU modules 181-1 through 181-4 and the circuit board 180. Similarly, a space part 201 having the same height j is formed between the CPU modules 181-5 through 181-8 and the circuit board 180.

The space part 200 at the upstream part is made to remain vacant so as to function as an air flow passage 205 for fresh air. By making use of the space part 201 at the downstream part, the control element 210 as well as the heat sink 211 are mounted in the space part 201 on the circuit board 180.

In the electronics device unit 10G, the air flow passable sectional clearance ratio at the downstream side is lower than the air flow passable sectional clearance ratio at the upstream side. In addition, the electronics device unit 10G has the air flow passage 205 for the fresh air at the upstream side.

The CPU modules 181-1 through 181-8 are cooled by the forced draft air that flows in the Y1 direction from the Y2 direction side in the electronics device unit 10G as in the following manner. The CPU modules 181-1 through 181-4 at the upstream part are cooled by the forced draft fresh air. The CPU modules 181-5 through 181-8 at the downstream part are cooled by both of the forced draft fresh air that passes through the space part 200 without raising the temperature of the fresh air and the air that passes through the CPU modules 181-1 through 181-4 at the upstream part with the temperature of this air being raised. Accordingly, the forced draft cooling of the CPUs 181-5 through 181-8 at the downstream part is promoted.

In the section of the tunnel orthogonal to the air flow in the electronics device unit, a ratio of a sectional clearance area to the sectional area of the tunnel will be described. This sectional clearance area is obtained by subtracting from the sectional area of the tunnel the sectional area occupied by the members that block the air flow. According to the present invention, the region of the electronics device unit is classified into the upstream part, the midstream part, and the downstream part. An average value of a ratio of a sectional area of a clearance at the upstream part to the sectional area of the tunnel may be larger than an average value of a ratio of a sectional area of a clearance at the midstream part to the sectional area of the tunnel, and the average value of the ratio of the sectional area of the clearance at the midstream part to the sectional area of the tunnel may be larger than an average value of a ratio of a sectional area of a clearance at the downstream part to the sectional area of the tunnel. On the other hand, the present invention include an embodiment of the electronics device unit in which the ratio of the sectional clearance area to the sectional area of the tunnel is partially increased in terms of the downstream direction of the air flow at a certain part of the region of the electronics device unit (that is, partially increased when the intended position is shifted to the downstream side).

What is claimed is:

1. An electronics device unit, comprising:
   a circuit board;
   a plurality of semiconductor components that are dispersedly mounted on the circuit board, the plurality of semiconductor components generating heat, heat sinks being mounted on the plurality of semiconductor components, respectively; and
   a cover member that is provided for covering the heat sinks and forms a tunnel on the circuit board, a cooling medium flowing in the tunnel,
   wherein the plurality of semiconductor components are cooled via the heat sinks by forcing the cooling medium to flow so as to pass through the tunnel,
   and the plurality of semiconductor components are arranged on the circuit board such that in a section of the tunnel orthogonal to a flow of the cooling medium in the electronics device unit, a ratio of a sectional area of a clearance at a downstream part of the flow of the cooling medium to a sectional area of the tunnel is smaller than a ratio of a sectional area of a clearance at an upstream part of the flow of the cooling medium to the sectional area of the tunnel, the sectional area of the clearance at the upstream part being obtained by subtracting from the sectional area of the tunnel a sectional area at the upstream part occupied by members that block the flow of the cooling medium, the sectional area of the clearance at the downstream part being obtained by subtracting from the sectional area of the tunnel a sectional area at the downstream part occupied by members that block the flow of the cooling medium.

2. The electronics device unit according to claim 1, wherein the members that block the flow of the cooling medium include the heat sinks.

3. The electronics device unit according to claim 1, wherein the electronics device unit includes the upstream part, a midstream part, and the downstream part of the flow of the cooling medium, the ratio of the sectional area of the clearance at the upstream part of the flow of the cooling medium to the sectional area of the tunnel is larger than a ratio of a sectional area of a clearance at a midstream part of the flow of the cooling medium to the sectional area of the tunnel, and the ratio of the sectional area of the clearance at the midstream part of the flow of the cooling medium to the sectional area of the tunnel is larger than the ratio of the sectional area of the clearance at the downstream part of the flow of the cooling medium to the sectional area of the tunnel.

4. The electronics device unit according to claim 1, wherein the plurality of semiconductor components are arranged on the circuit board so as to form a fresh cooling medium supplying passage at the upstream part of the flow of the cooling medium at an outer side of a region on which the semiconductor components are mounted, the semiconductor components not existing in the fresh cooling medium supplying passage, the cooling medium flowing in the fresh cooling medium supplying passage without contacting with the heat sinks.

5. The electronics device unit according to claim 4, further comprising an isolation plate that is disposed along the fresh cooling medium supplying passage, and isolates the fresh cooling medium supplying passage from the region on which the semiconductor components are mounted.

6. The electronics device unit according to claim 1, wherein the plurality of semiconductor components are arranged on the circuit board such that a first space part is formed between the semiconductor components mounted at the downstream part of the flow of the cooling medium and the semiconductor components mounted directly upstream of the semiconductor components mounted at the downstream part of the flow of the cooling medium, and the first space part is wider than a second space part formed at the upstream part of the flow of the cooling medium.

7. The electronics device unit according to claim 1, wherein the plurality of semiconductor components are arranged on the circuit board such that a fresh cooling medium supplying passage is formed at the upstream part of the flow of the cooling medium, the cooling medium flowing in the fresh cooling medium supplying passage without contacting with the heat sinks, the plurality of semiconductor components are arranged on the circuit board such that a space part is formed between the semiconductor components mounted at the downstream part of the flow of the cooling medium and the semiconductor components mounted directly upstream of the semiconductor components mounted at the downstream part, and the electronics device unit further comprises a guide member that guides to the space part the fresh cooling medium that passes through the fresh cooling medium supplying passage.

8. The electronics device unit according to claim 1, wherein the cover member comprises a throttling part, the throttling part being formed on a part of the cover member that faces the semiconductor components mounted at the downstream part of the flow of the cooling medium, the throttling part making the sectional area of the tunnel narrow.

9. The electronics device unit according to claim 1, wherein the plurality of semiconductor components are arranged on the circuit board such that a fresh cooling medium supplying passage is formed at the upstream part of the flow of the cooling medium at an outer side of a region on which the semiconductor components are mounted, the cooling medium flowing in the fresh cooling medium supplying passage without contacting with the heat sinks, the plurality of semiconductor components are arranged on the circuit board such that a space part is formed between the semiconductor components mounted at the downstream part of the flow of the cooling medium and the semiconductor components mounted directly upstream of the semiconductor components mounted at the downstream part of the flow of the cooling medium, and the electronics device unit further comprises a U-shaped isolation member that is provided at a narrow space between the cover member and the heat sinks, the U-shaped isolation member including an upstream member that covers a part corresponding thereto at the upstream part at a region on which the semiconductor components are mounted, the U-shaped isolation member further including side members that cover parts corresponding thereto, respectively, along the flow of the cooling medium at both sides of the region on which the semiconductor components are mounted.

10. The electronics device unit according to claim 9, further comprising a ceiling plate that is positioned at the space part at a height of top parts of the heat sinks on the semiconductor components at the downstream part.

11. The electronics device unit according to claim 4, further comprising a motor fan unit that is provided in the fresh cooling medium supplying passage.

12. The electronics device unit according to claim 1, wherein the cover member includes a ceiling plate part, and a recessed part formed on the ceiling plate part, the recessed part facing the heat sinks on the semiconductor components at the upstream part, the recessed part being recessed in a direction of being separated from the heat sinks.

13. The electronics device unit according to claim 1, wherein a place at which the plurality of the semiconductor components are mounted is divided into at least three regions with respect to a direction of the flow of the cooling medium, space parts are formed between the at least three regions, respectively, and as the space part is located at the more downstream side, the space part becomes wider.

14. The electronics device unit according to claim 1, wherein positions of the heat sinks on the semiconductor components at the downstream part are shifted from positions of the heat sinks on the semiconductor components at the upstream part with respect to a direction orthogonal to the flow of the cooling medium.

15. An electronics device unit comprising:

a circuit board on which components are mounted;

a plurality of semiconductor component modules each of which comprises a semiconductor component mounted on a vertical board with a heat sink being mounted on the semiconductor component, and the vertical board mounted on the circuit board with the vertical board standing vertically to the circuit board, an upstream space part being formed between the heat sinks and an upper surface of the circuit board at an upstream part of a flow of a cooling medium in the electronics device unit, a downstream space part being formed between the heat sinks and the upper surface of the circuit board at a downstream part of the flow of the cooling medium;

cover members that cover the plurality of semiconductor component modules, respectively, make the upstream space part an upstream tunnel on the circuit board in which the cooling medium flows, and makes the downstream space part a downstream tunnel on the circuit board; and electronic components that are mounted on the circuit board so as to be located in the downstream tunnel, the upstream tunnel being vacant.

* * * * *

UNITED STATES PATENT AND TRADEMARK OFFICE
CERTIFICATE OF CORRECTION

PATENT NO. : 6,888,725 B2
DATED : May 3, 2005
INVENTOR(S) : Hideo Kubo et al.

It is certified that error appears in the above-identified patent and that said Letters Patent is hereby corrected as shown below:

<u>Title page,</u>
Item [57], ABSTRACT,
Line 3, delete "CPUS" and insert -- CPUs --.

Signed and Sealed this

Third Day of January, 2006

JON W. DUDAS
*Director of the United States Patent and Trademark Office*